(12) United States Patent
Yoo et al.

(10) Patent No.: US 9,793,356 B2
(45) Date of Patent: Oct. 17, 2017

(54) SEMICONDUCTOR DEVICE AND METHOD FOR FABRICATING THE SAME

(71) Applicants: Jeong-Ho Yoo, Seongnam-si (KR); Byeong-Chan Lee, Yongin-si (KR); Hyun-Ho Noh, Hwaseong-si (KR); Yong-Kook Park, Yongin-si (KR); Bon-Young Koo, Suwon-si (KR); Jin-Yeong Joe, Suwon-si (KR)

(72) Inventors: Jeong-Ho Yoo, Seongnam-si (KR); Byeong-Chan Lee, Yongin-si (KR); Hyun-Ho Noh, Hwaseong-si (KR); Yong-Kook Park, Yongin-si (KR); Bon-Young Koo, Suwon-si (KR); Jin-Yeong Joe, Suwon-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 14/824,057

(22) Filed: Aug. 11, 2015

(65) Prior Publication Data
US 2016/0079367 A1    Mar. 17, 2016

(30) Foreign Application Priority Data

Sep. 12, 2014 (KR) .......... 10-2014-0121093
Jun. 30, 2015 (KR) .......... 10-2015-0093415

(51) Int. Cl.
| | | |
|---|---|---|
| H01L 29/16 | (2006.01) | |
| H01L 29/78 | (2006.01) | |
| H01L 21/8238 | (2006.01) | |
| H01L 21/84 | (2006.01) | |
| H01L 29/66 | (2006.01) | |
| H01L 27/092 | (2006.01) | |
| H01L 27/12 | (2006.01) | |

(52) U.S. Cl.
CPC .. *H01L 29/1608* (2013.01); *H01L 21/823821* (2013.01); *H01L 21/845* (2013.01); *H01L 27/0924* (2013.01); *H01L 27/1211* (2013.01); *H01L 29/66545* (2013.01); *H01L 29/66795* (2013.01); *H01L 29/785* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 8,153,493 | B2 | 4/2012 | Lee |
| 8,362,574 | B2 | 1/2013 | Kawasaki et al. |
| 8,461,634 | B2 | 6/2013 | Yang et al. |
| 8,610,241 | B1 | 12/2013 | Hu et al. |
| 9,123,826 | B1 * | 9/2015 | Harley .................. H01L 29/04 |
| 2011/0227162 | A1 | 9/2011 | Lin et al. |
| 2012/0138886 | A1 | 6/2012 | Kuhn et al. |
| 2013/0049068 | A1 | 2/2013 | Lin et al. |

(Continued)

*Primary Examiner* — Angel Roman
*Assistant Examiner* — Kevin Quinto
(74) *Attorney, Agent, or Firm* — Muir Patent Law, PLLC

(57) ABSTRACT

A semiconductor device may have a structure that prevents or reduces an etching amount of certain portions, such as a part of a source/drain region. Adjacent active fins may be merged with a blocking layer extending between adjacent the source/drain region. The blocking layer may be of a material that is relatively high-resistant to the etchant.

25 Claims, 33 Drawing Sheets

(56) References Cited

U.S. PATENT DOCUMENTS

2013/0277752 A1 10/2013 Glass et al.
2013/0334606 A1 12/2013 Shen et al.
2014/0054648 A1 2/2014 Itokawa et al.
2014/0061734 A1 3/2014 Basker et al.
2014/0070328 A1 3/2014 Goto et al.

\* cited by examiner

SEMICONDUCTOR DEVICE AND METHOD FOR FABRICATING THE SAME

CROSS-REFERENCE TO RELATED APPLICATION

This application claims priority from Korean Patent Application No. 10-2014-0121093 filed on Sep. 12, 2014 and No. 10-2015-0093415 filed on Jun. 30, 2015 in the Korean Intellectual Property Office, and all the benefits accruing therefrom under 35 U.S.C. 119, the contents of which in its entirety are herein incorporated by reference.

TECHNICAL FIELD

The present inventive concept relates to a semiconductor device and a method for fabricating the same.

BACKGROUND

In recent years, semiconductor devices have been developed to operate at high speeds and at low voltages, and a fabrication process of the semiconductor device has developed such that integration is improved.

Concerns about fin field-effect transistors (FinFETs) in which a channel is formed in a 3D space structure have increased, e.g., being more resistant to the short channel effect and providing higher drive current at low voltages than a traditional field-effect transistor.

SUMMARY

The disclosure provides a semiconductor device having a structure that prevents a part of a source/drain from being etched due to provision of an etchant into a void space, when forming an elevated source/drain during a process of fabricating a FinFET device having a merged active fin.

The disclosure also provides a method for fabricating the semiconductor device having a structure that prevents a part of a source/drain from being etched due to provision of etchant into a void space, when forming an elevated source/drain during a process of fabricating a FinFET device having a merged active fin.

An embodiment of the present inventive concept provides a semiconductor device, including first and second active fins, which may extend in a first direction and be separated from each other in a second direction on a substrate. The semiconductor device also includes a gate structure, which may extend in the second direction on the first and second active fins, a first semiconductor pattern formed on the first active fin and disposed at least at one side of the gate structure, and a second semiconductor pattern formed on the second active fin and disposed at least at one side of the gate structure. The first semiconductor pattern may include a first pattern, including a first semiconductor material, and a second pattern, disposed below a downwardly facing side of the first pattern between the first and second active fins and including a second semiconductor material different from the first semiconductor material. The second semiconductor pattern may include a third pattern, including the first semiconductor material, and a fourth pattern, disposed below a downwardly facing side of the third pattern between the first and second active fins, including the second semiconductor material, and contacting the second pattern.

Another embodiment of the present inventive concept provides a semiconductor device, including first and second active fins, which may extend in a first direction and be separated in a second direction on a substrate. The semiconductor device also includes a gate structure, which may extend in the second direction on the first and second active fins, a first semiconductor pattern formed on the first active fin, a second semiconductor pattern formed on the second active fin, and a field insulating layer formed between the first and second active fins. The semiconductor device may further include a first pattern above the field insulating layer that merges the first and second semiconductor patterns by being formed between the first and second semiconductor patterns, and a second pattern formed on the first pattern, first semiconductor pattern, and second semiconductor pattern and including a first semiconductor material different from the first pattern.

Another embodiment of the present inventive concept provides a semiconductor device, including a substrate in which a first region and a second region may be defined, first and second active fins, which may extend in a first direction in the first region of the substrate and be separated from each other in a second direction in crossing the first direction, a first gate structure, which may extend in the second direction on the first and second active fins, a first semiconductor pattern, which may be formed of a first semiconductor material on the first and second active fins and disposed at least at one side of the first gate structure, a second semiconductor pattern, which may be formed of a second semiconductor material different from the first semiconductor material below a bottom facet of the first semiconductor pattern between the first and second active fins. The semiconductor device also may include third and fourth active fins, which may extend in the first direction in the second region of the substrate and be separated from each other in the second direction, a second gate structure which may extend in the second direction on the third and fourth active fins, and a third semiconductor pattern, which may be formed on the third and fourth active fins of the second semiconductor material and be disposed at least at one side of the second gate structure.

An embodiment of the present inventive concept provides a method for fabricating a semiconductor device, including a forming of first and second fins, which may extend in a first direction on a substrate, a forming of a dummy gate electrode, which may extend in a second direction in crossing the first direction on the first and second fins, and an epitaxial growing of first and second semiconductor patterns on the first and second fins, disposed at least at one side of the dummy gate electrode. Where the first and second semiconductor patterns do not contact each other, the method for fabricating the semiconductor device may further include forming a blocking layer of a material different from the first and second semiconductor patterns below bottom facets of the first and second semiconductor patterns between the first and second fins and may include removing the dummy gate electrode.

The semiconductor device of some exemplary embodiments may be an NMOS transistor, and the first and second semiconductor patterns (i.e. the source/drain regions) may include the same material as the substrate and/or a material that induces tensile stress (e.g. SiP, SiC, and/or SiCP). In other embodiments, the semiconductor device is a PMOS transistor, and the first and second semiconductor patterns may include a material that induces compressive stress (e.g., SiGe). The first and second semiconductor patterns may be selectively epitaxially grown, and the blocking layers may be formed to merge the first and second semiconductor patterns. This may be accomplished with blocking layers formed on bottom side walls where they only face each other, but the blocking layers may also be formed on all lower sides and even on the entire outer surface of the first and second semiconductor patterns.

Exposed, upper portions of the first and second semiconductor patterns may be covered by an epitaxial layer or an upper pattern. The epitaxial layer or upper pattern may include the first semiconductor material, e.g., SiP, and the concentration of dopants included in the upper (or epitaxial) pattern may be higher than that of dopants included in the first and second patterns.

DETAILED DESCRIPTION OF THE EMBODIMENTS

Figure 1:
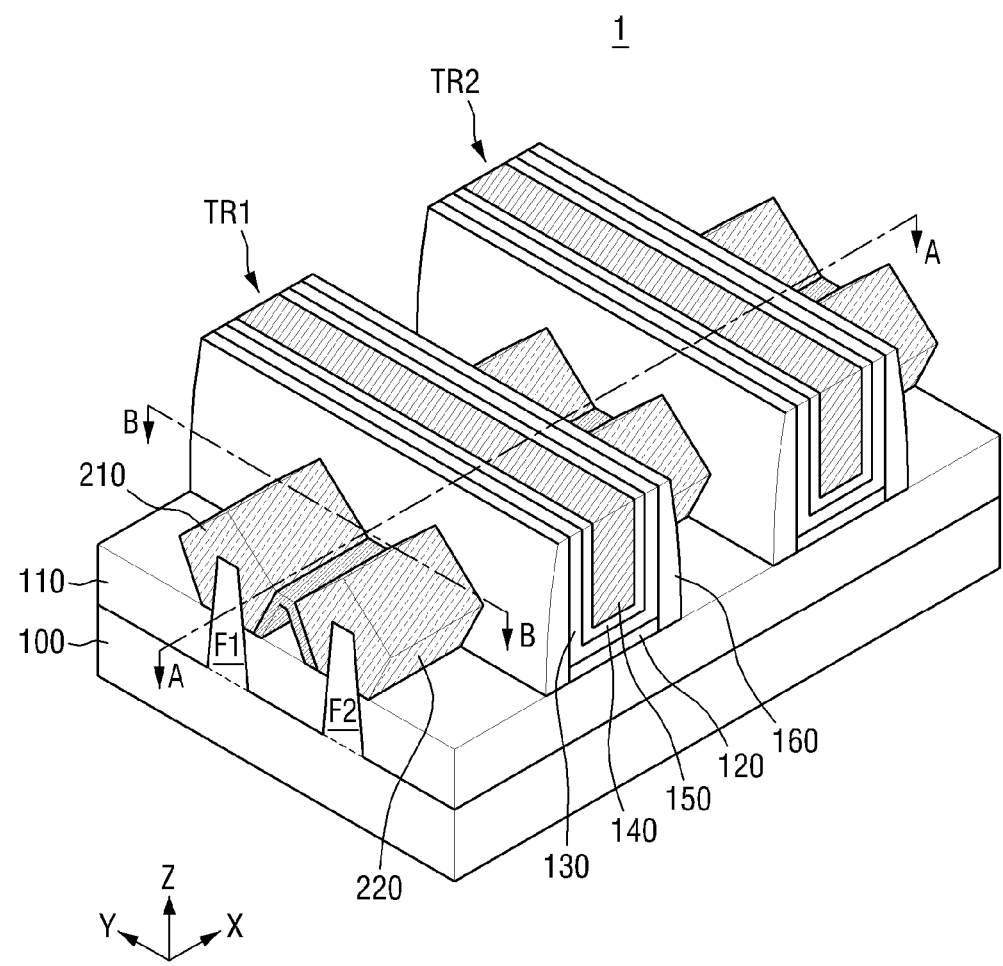
FIG. 1 is a perspective view to illustrate a semiconductor device according to example embodiments of the present inventive concept.

Advantages and features of the present disclosure and methods of accomplishing the same may be understood more readily by reference to the following detailed description of the embodiments and the accompanying drawings. The present inventive concept may, however, be embodied in many different forms and should not be construed as being limited to the embodiments set forth herein. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises," "includes," "including," and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures may be schematic in nature and their shapes may not illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a semiconductor device according to a first embodiment of the present inventive concept will be described.

Figure 2:
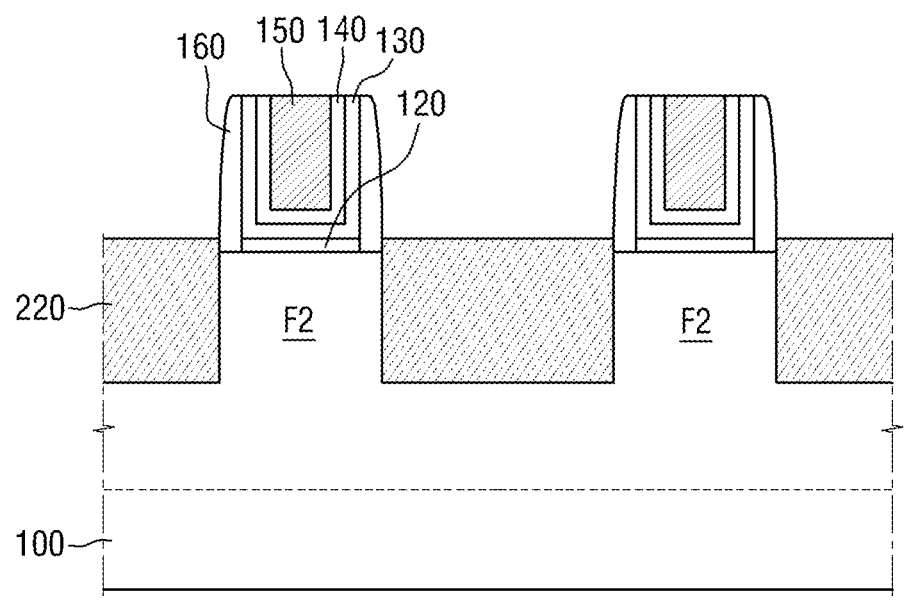
FIG. 2 is a cross-sectional view taken along line A-A of FIG. 1.
Figure 3:
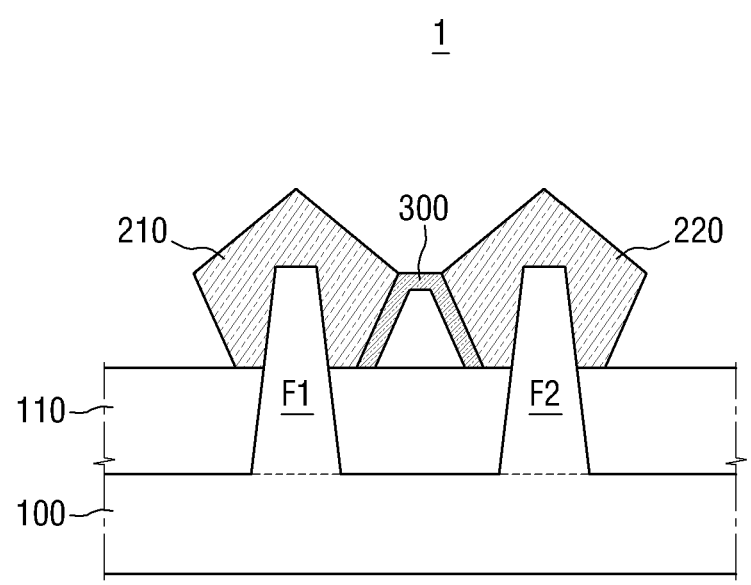
FIG. 3 is a cross-sectional view taken along line B-B of FIG. 1.

FIG. 1 is a perspective view to illustrate a semiconductor device according to example embodiments of the present inventive concept. FIG. 2 is a cross-sectional view taken along line A-A of FIG. 1. FIG. 3 is a cross-sectional view taken along line B-B of FIG. 1.

Referring to FIGS. 1 to 3, the semiconductor device 1 according to example embodiments of the present inventive concept includes a substrate 100, a field insulating layer 110, a first active fin F1, a second active fin F2, a first gate structure TR1, a second gate structure TR2, a first semiconductor pattern 210, a second semiconductor pattern 220, and a blocking layer 300.

The substrate 100 may be a rigid substrate such as a silicon substrate, a silicon on insulator (SOI) substrate, a gallium arsenide substrate, a silicon germanium substrate, a ceramic substrate, a quartz substrate, and a glass substrate for a display. The substrate 100 may also be a flexible plastic substrate such as polyimide, polyester, polycarbonate, polyethersulfone, polymethylmethacrylate, polyethylene naphthalate, and polyethyleneterephthalate. The substrate may be formed of a crystalline material, such as a crystalline semiconductor material, such as those semiconductor materials described above and elsewhere herein.

The substrate 100 may include a first region I and a second region II. The first region I and the second region II may be divided by the field insulating layer 110, such as by shallow trench isolation (STI). Herein, the first region I may be an NMOS region and the second region II may be a PMOS region, but the present inventive concept is not limited thereto and the first region I may be the PMOS region and the second region II may be the NMOS region. See, e.g., FIG. 15.

However, hereinafter, the NMOS region of the substrate 100 will be described for ease of description, but it will be recognized that appropriate portions of the description are also applicable to the PMOS region.

The field insulating layer 110 may be formed on the substrate 100 to be used for element separation. The field insulating layer 110 as an insulating layer may be a high density plasma (HDP) oxide layer, a spin-on glass (SOG) oxide layer, a chemical vapor deposition (CVD) oxide layer, or the like, but the present inventive concept is not limited thereto.

The first active fin F1 and the second active fin F2 are formed on the substrate 100. The first active fin F1 and the second active fin F2 may be formed to protrude from the substrate 100. The first active fin F1 and the second active fin F2 may be formed to protrude in a third direction Z from the substrate 100.

The first active fin F1 and the second active fin F2 may be considered a part of the substrate 100 and include an epitaxial layer, which is grown from the main body of the substrate 100 or may be formed by etching the main body of the substrate.

The first active fin F1 and the second active fin F2 may extend in a first direction X. The field insulating layer 110 may cover the top of the substrate 100 and sides of the first and second active fins F1 and F2.

The first active fin F1 and the second active fin F2 may have long sides and short sides. The first active fin F1 and the second active fin F2 are separated from each other to be disposed on the substrate 100. For example, the first active fin F1 and the second active fin F2 may be separated from each other in a second direction Y across the first direction X. In FIG. 1, a long-side direction is illustrated as the first direction X and the short-side direction is illustrated as the second direction Y, but the present inventive concept is not limited thereto. For example, in the first active fin F1 and the second active fin F2, the long-side direction may be the second direction Y and the short-side direction may be the first direction X.

The first gate structure TR1 may be formed on the first active fin F1 and the second active fin F2 in a direction to cross the first and second active fins F1 and F2. The first gate structure TR1 may extend in the second direction Y.

The first gate structure TR1 may include an interface layer 120, a gate insulating layer 130, a work function control layer 140, gate metal 150, a gate spacer 160, and the like which are sequentially formed on the first active fin F1 and the second active fin F2. Channel regions may be formed on both sides and the tops of the first active fin F1 and the second active fin F2 and are crossed over by the first gate structure TR1. The interface layer 120 may be formed on the field insulating layer 110 and the first and second active fins F1 and F2. The interface layer 120 may serve to prevent a defective interface between the field insulating layer 110 and the gate insulating layer 130.

The interface layer 120 may include a low-dielectric material layer having a dielectric constant k of 9 or less, such as a silicon oxide layer (k is approximately 4) or a silicon oxynitride layer (k is approximately 4 to 8 depending on contents of an oxygen atom and a nitride atom). In some embodiments, the interface layer 120 may be made of silicate and/or made of a combination of the aforementioned layers. In other embodiments, the interface layer 120 may be not formed.

The gate insulating layer 130 may be formed on the interface layer 120. However, when the interface layer 120 is not present, the gate insulating layer 130 may be formed on the field insulating layer 110 and the first and second active fins F1 and F2.

The gate insulating layer 130 may include a material having a high-dielectric constant (high-k). The gate insulating layer 130 may include, for example, HfSiON, HfO2, ZrO2, Ta2O5, TiO2, SrTiO3, BaTiO3, and/or SrTiO3.

The gate insulating layer 130 may be formed with an appropriate thickness depending on a type of a semiconductor device (e.g., transistor) to be formed. For example, when the gate insulating layer 130 is HfO$_2$, the gate insulating layer 130 may be formed with a thickness of approximately 50 Å or less (approximately 5 Å to 50 Å), but the present inventive concept is not limited thereto. According to some embodiments of the present inventive concept, as illustrated in FIG. 1, the gate insulating layer 130 may extend upwards along a side wall of the gate spacer 160 to be described below.

The work function control layer 140 may be formed on the gate insulating layer 130. The work function control layer 140 may be formed in contact with the gate insulating layer 130. The work function control layer 140 is used to control a work function.

The work function control layer 140 may include, for example, metal nitride. For example, the work function control layer 140 may include Mo, Pd, Ru, Pt, TiN, WN, TaN, Ir, TaC, RuN, TiAl, TaAlC, TiAlN, and/or MoN. In more detail, the work function control layer 140 may be configured by, for example, a single layer made of TiN or a dual layer configured by a TiN lower layer and a TaN upper layer, but the present inventive concept is not limited thereto.

According to some embodiments of the present inventive concept, as illustrated in FIG. 1, the work function control layer 140 may also extend upwards along the side wall of the gate spacer 160 to be described below.

The gate metal 150 may be formed on the work function control layer 140. The gate metal 150 may be formed in contact with the work function control layer 140 as illustrated in FIG. 1. That is, the gate metal 150 may be formed to fill a space generated by the work function control layer 140. The gate metal 150 may include a conductive material, for example, W or Al, but the present inventive concept is not limited thereto.

The gate spacer 160 may be formed on at least one of the sides of the first gate structure TR1. The gate spacer 160 may include at least one of a nitride layer, an oxy-nitride layer, and a low-k material.

One side of the gate spacer 160 is illustrated by a curve, but the present inventive concept is not limited thereto and a shape of the gate spacer 160 may be different therefrom. For example, the shape of the gate spacer 160 may have an I shape or an L shape (not shown).

In FIG. 1, the gate spacer 160 is constituted by a single homogenous layer, but the present inventive concept is not limited thereto and the gate spacer 160 may be constituted by a plurality of layers.

A source/drain region may be formed on at least one of both sides of the first gate structure TR1 and/or from the first and second active fins F1 and F2. The source/drain region and the first gate structure TR1 may be insulated from each other by at least the gate spacer 160.

When the semiconductor device 1 is an NMOS transistor, the source/drain region may include the same material as the substrate 100 and/or a material that induces tensile stress. For example, when the substrate 100 is Si, the source/drain region may be Si or a material (for example, SiC, SiP and/or SiCP) having a smaller lattice constant than that of the channel region (in this example, smaller than the lattice constant of Si). The tensile stress material applies tensile stress to the first and second active fins F1 and F2 below the first gate structure TR1 such that the channel region may have an improved mobility of electrons.

When the semiconductor device 1 is a PMOS transistor, the source/drain region may include a material that induces compressive stress. For example, the compression stress material may be a material having a larger lattice constant than that of the channel region (in this example, larger than that of the Si channel region) (e.g., SiGe). The compression stress material applies compressive stress to the first and second active fins F1 and F2 below the first gate structure TR1 such that the channel region may have an improved mobility of holes.

In some embodiments of the present inventive concept, the source/drain region may be formed through an epitaxial growth, but the present inventive concept is not limited thereto.

The semiconductor patterns 210 and 220 may be formed by sequentially growing a series of layers that may have crystalline lattice constants that are different from at least some of the other ones of these layers. For example, if the semiconductor patterns 210 and 220 are epitaxial SiGe, layers of the semiconductor patterns may be formed with different percentages of Si and Ge (e.g., different ratios of Si to Ge). Similarly, the layers may have different percentages of Si and C (e.g., different ratios of Si to C) may be used when the semiconductor patterns 210 and 220 are epitaxial SiC.

The second gate structure TR2 may be formed on the first active fin F1 and the second active fin F2 in the direction crossing the first and second active fins F1 and F2. The second gate structure TR2 may extend in the second direction Y.

The second gate structure TR2 may include substantially the same configuration as the first gate structure TR1 described above.

The first semiconductor pattern 210 may be formed on the first active fin F1 and disposed on at least one side of the first gate structure TR1. The first semiconductor pattern 210 may be formed on the first active fin F1 by using a selective epitaxial growth (SEG) process.

Alternatively, the first semiconductor pattern 210 may be formed by filling a recess, formed in at least a part of the first active fin F1. The first semiconductor pattern 210 may in such a case be formed by using the SEG (selective epitaxial growth) process. An upper surface of the active fin F1 may extend into the first semiconductor pattern 210 (as shown in FIG. 1) or be flush with a bottom surface of the first semiconductor pattern 210.

In the NMOS region of the FinFET device, when the first semiconductor pattern 210 is formed, the first semiconductor pattern 210 may be made of a material capable of providing the tensile stress. That is, tensile stress may be provided to the channel region by the first semiconductor pattern 210. Therefore, the first semiconductor pattern 210 may be made of the material having the smaller lattice constant than the substrate 100 and for example, when the substrate 100 is made of silicon (Si), the first semiconductor pattern 210 may include SiP. SiP may be silicon doped with phosphorus. Phosphorus may serve as a charge carrier dopant. In some embodiments, the first semiconductor pattern 210 may include silicon carbon (SiC) or phosphorus-doped silicon carbon (SiCP).

The second semiconductor pattern 220 is formed on the second active fin F2. The second semiconductor pattern 220 may be formed on the second active fin F2 by using the SEG process.

Alternatively, the second semiconductor pattern 220 may be formed by filling a recess which is formed in at least a part of the second active fin F2. The second semiconductor pattern 220 may in such a case be formed by using the SEG process. An upper surface of the active fin F2 may extend into the first semiconductor pattern 220 (as shown in FIG. 1) or be flush with a bottom surface of the first semiconductor pattern 220.

The second semiconductor pattern 220 may be made of a material capable of applying the tensile stress to the channel region, like the first semiconductor pattern 210. The second semiconductor pattern 220 may include the same material as that of the first semiconductor pattern 210. The second semiconductor pattern 220 may be formed while forming the first semiconductor pattern 210, but the first semiconductor pattern 210 and the second semiconductor pattern 220 may also be independently formed.

When the first semiconductor pattern 210 and the second semiconductor pattern 220 are formed by the SEG process, <100>-directional facets may be formed in the first semiconductor pattern 210 and the second semiconductor pattern 220 due to a feature of the fin structure; this may result in a diamond-shaped profile or another polygonal shape (e.g., heptagonal, hexagonal, and octagonal). For example, the first and second semiconductor patterns may have a lower facet that has a shape that grows outwardly, in terms of its width, at an intersecting angle in an upwardly direction (direction Z of FIG. 1) from the field insulating layer 110 until reaching a first point. At the first point an upper facet may then extend substantially vertically, further outward, or inward before it or another facet(s) bends inwards to make contact at a point or at a flat surface (or even a rounded upper surface). Where the first and second semiconductor patterns 210, 220 do not merge (e.g., due to stopping their epitaxial growth at a point where they are not large enough to merge), a blocking layer may be formed to connect them.

When a merged fin structure is to be formed by growing the first semiconductor pattern 210 and the second semiconductor pattern 220 close to each other, a void space may be generated in a lower part between the first semiconductor pattern 210 and the second semiconductor pattern 220 due to a feature of the profile. In a subsequent process, when etchant flows (for example, ammonia solution) into the void space, lower surfaces of the first semiconductor pattern 210 and the second semiconductor pattern 220 may be etched.

For example, when ammonia solution is used as the etchant while removing a dummy gate electrode, and a path is formed between the dummy gate electrode and the void space, the etchant (the ammonia solution in this example) may flow into the void space through the path, and the lower surfaces of the first semiconductor pattern 210 and the second semiconductor pattern 220 exposed to the void space may be etched.

However, before forming the merged fin structure by merging the first semiconductor pattern 210 and the second semiconductor pattern 220, which are adjacent to each other, the blocking layer 300 may be formed on the bottoms facets of and in between the first semiconductor pattern 210 and the second semiconductor pattern 220 to protect the first semiconductor pattern 210 and the second semiconductor pattern 220 from the etchant (for example, the ammonia solution) that would otherwise have flowed into the void space. It is noted that the semiconductor pattern 210 and the semiconductor pattern 220 may contact each other or not have any contact between them. Etching of the first semiconductor pattern 210 and the second semiconductor pattern 220 may influence characteristics of semiconductor devices, and as a result, a problem in reliability may occur. By adding blocking layer 300, etching of the first and second semiconductor patterns 210 and 220 may be reduced or prevented.

The blocking layer 300 may be made of a different material than the first semiconductor pattern 210 and the second semiconductor pattern 220. That is, in the NMOS region, when SiP is included in the first semiconductor pattern 210 and the second semiconductor pattern 220, the blocking layer 300 may include a material with a relatively high-resistance to the etchant (for example, the ammonia solution) as compared to SiP. As the material for the blocking layer 300, e.g., SiGe may be used. However, the material with the relatively high-resistance to the etchant (for example, the ammonia solution) is not limited to SiGe and the blocking layer 300 may include a material different therefrom.

The blocking layer 300 is disposed below bottom facets (which face downwardly toward the substrate 100) of the first semiconductor pattern 210 and the second semiconductor pattern 220 between the first semiconductor pattern 210 and the second semiconductor pattern 220. The blocking layer 300 may be formed to merge the first semiconductor pattern 210 and the second semiconductor pattern 220. The blocking layer 300 may be disposed on the bottom facets of the first semiconductor pattern 210 and the second semiconductor pattern 220 and between the first semiconductor pattern 210 and the second semiconductor pattern 220. The blocking layer 300 may be formed to entirely cover the bottom facets of the first semiconductor pattern 210 and the second semiconductor pattern 220, and a region above the void in between the first semiconductor pattern 210 and the second semiconductor pattern 220.

The first semiconductor pattern 210 and the second semiconductor pattern 220 may include n-type impurities, such as, phosphorus.

The blocking layer 300 may include the material with the relatively high-resistance to the etchant (for example, the ammonia solution), e.g., SiGe.

Herein, when SiGe is included in the blocking layer 300, Ge in a range of 5 atomic percent (at %) to 10 at % may be included. Ge included in the blocking layer 300 serves to protect the bottoms of the first semiconductor pattern 210 and the second semiconductor pattern 220, but when the concentration of Ge is excessively high, the excessively high concentration of Ge may influence a stress characteristic of the first semiconductor pattern 210 and the second semiconductor pattern 220, and as a result, it may be preferred to include Ge in a range of 5 at % to 10 at % in the blocking layer 300.

Hereinafter, a semiconductor device according to other embodiments of the present inventive concept will be described.

Figure 4:
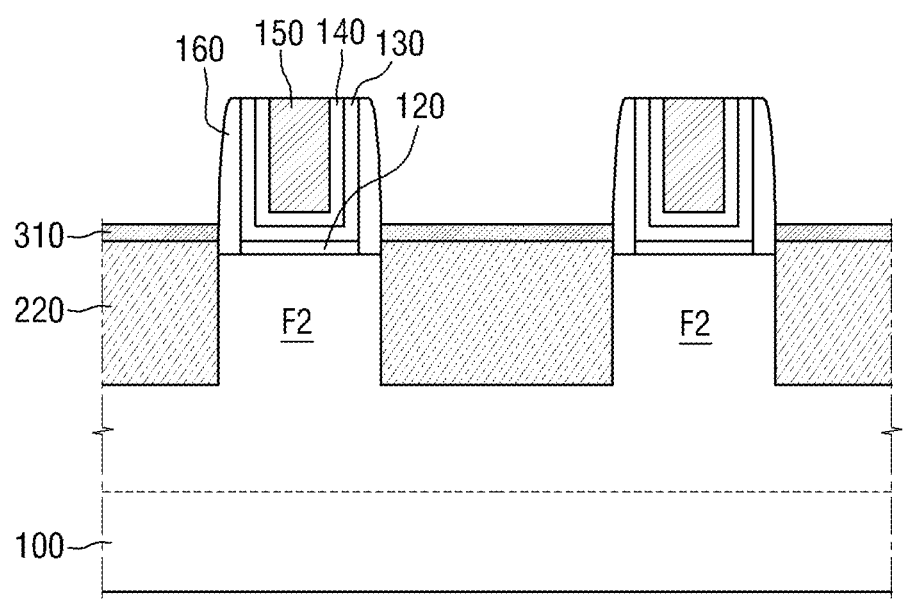
FIGS. 4 and 5 are cross-sectional views taken along lines A-A and B-B of FIG. 1, respectively, to illustrate a semiconductor device according to example embodiments of the present inventive concept.
Figure 5:
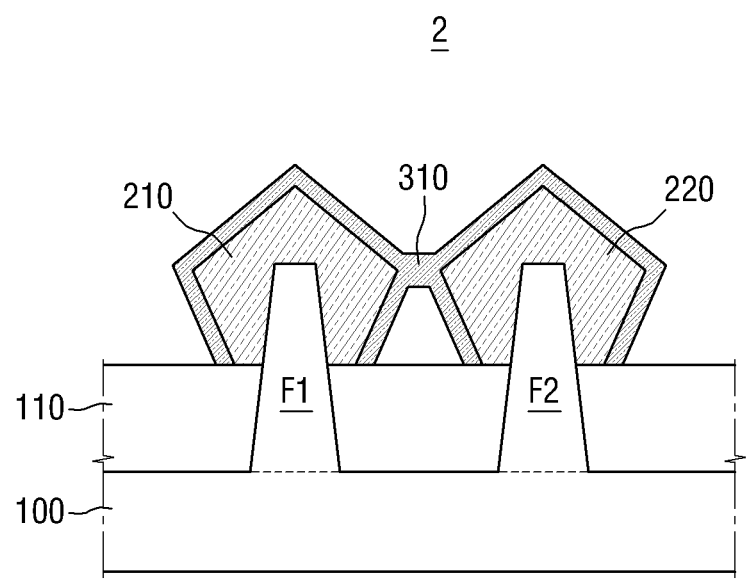

FIGS. 4 and 5 are cross-sectional views of a semiconductor device according to example embodiments of the present inventive concept. A description of parts which is substantially the same as the parts described for the semiconductor device 1 of FIGS. 1 to 3 according to example embodiments of the present inventive concept may be omitted.

Referring to FIGS. 4 and 5, a semiconductor device 2 according to the example embodiments of the present inventive concept is formed so that the blocking layer 310 entirely covers the external surfaces of the first and second semiconductor patterns 210 and 220.

In detail, the blocking layer 310 may be formed by epitaxially growing the surfaces of the first and second semiconductor patterns 210 and 220 as a base but without completely merging the first and second semiconductor patterns 210 and 220.

According to the semiconductor device 2, the first semiconductor pattern 210 and the second semiconductor pattern 220 may include the n-type impurities (e.g., phosphorus) The first semiconductor pattern 210 and the second semiconductor pattern 220 may include, e.g., SiP. However, the present inventive concept is not limited thereto.

The blocking layer 310 may include the material with the relatively high-resistance to the etchant (for example, the ammonia solution), e.g., SiGe. Herein, when SiGe is included in the blocking layer 310, Ge in a range of 5 at % to 10 at % may be included.

Figure 6:
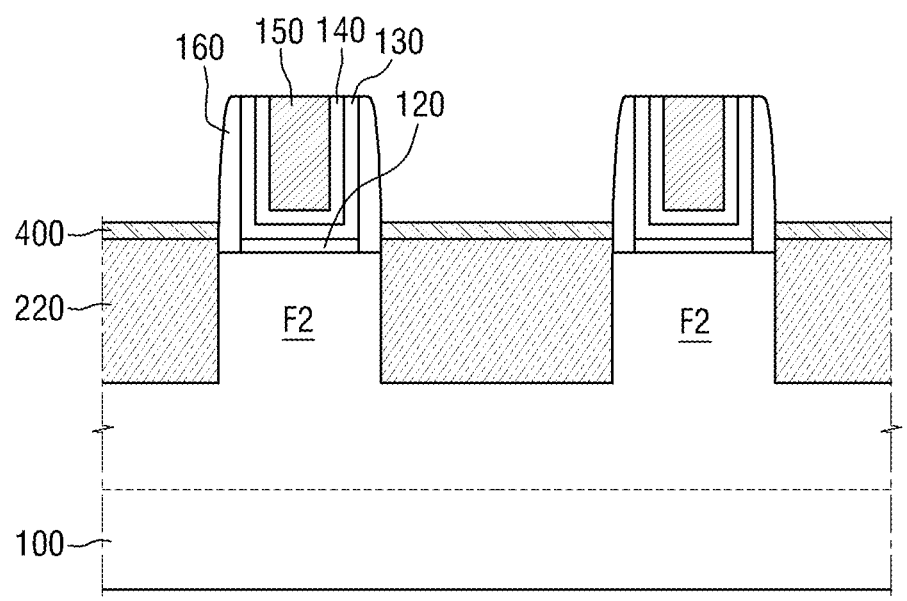
FIGS. 6 and 7 are cross-sectional views taken along lines A-A and B-B of FIG. 1, respectively, to illustrate a semiconductor device according to example embodiments of the present inventive concept.
Figure 7:
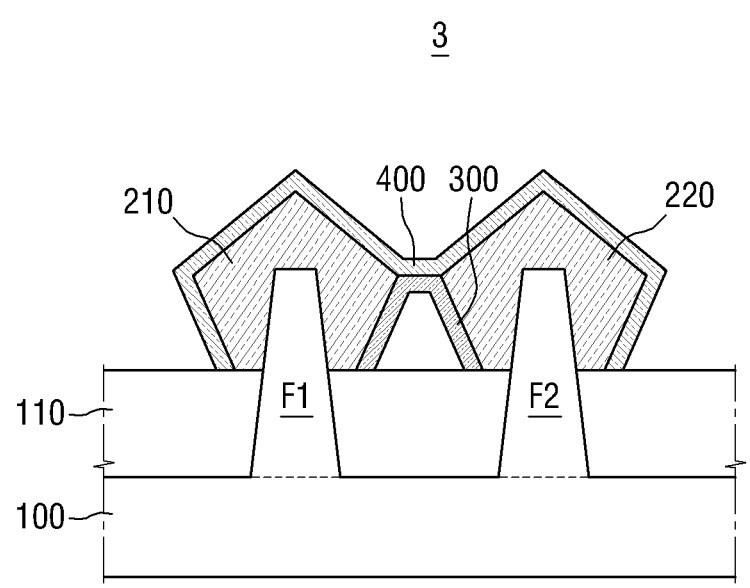

FIGS. 6 and 7 are cross-sectional views of a semiconductor device according to example embodiments of the present inventive concept. For convenience of description, the description of parts which is substantially the same as the parts described in the semiconductor device 1 of FIGS. 1 to 3 according to example embodiments of the present inventive concept will be omitted.

Referring to FIGS. 6 and 7, in a semiconductor device 3 according to the third embodiment of the present inventive concept, the blocking layer 300 may be disposed below bottom facets of the first and second semiconductor patterns 210 and 220 between the first and second semiconductor patterns 210 and 220. In the semiconductor device 3, a capping epitaxial layer 400 may be disposed on exposed surfaces of the first and second semiconductor patterns 210 and 220. Except for surfaces of the first and second semiconductor patterns 210 and 220 facing the void between the first and second semiconductor patterns 210 and 220 (covered by the blocking layer), the epitaxial layer 400 may cover the remaining surfaces of the first and second semiconductor patterns 210 and 220. In some embodiments, unlike the blocking layer 300 connecting the first and second semiconductor patterns 210 and 220 as illustrated in FIG. 7, the blocking layer 300 may be formed separately on (discontinuously on) the first and second patterns 210 and 220 and the first and second semiconductor patterns 210 and 220 may be connected (or merged) by only the capping epitaxial layer 400 (e.g., a continuous blocking layer 300 is not formed to extend between the first and second semiconductor patterns 210 and 220).

In detail, after epitaxially growing the surfaces of the first and second semiconductor patterns 210 and 220 as a base but without completely merging the first and second semiconductor patterns 210 and 220, the blocking layer may be epitaxially grown on the surfaces of the first and second semiconductor patterns 210 and 220 exposed to the outside. Those portions of the blocking layer that are not facing the void space between the first and second semiconductor patterns 210 and 220 may then be removed (e.g., with an etching process, such as a dry etching process) to form the blocking layer 300 in the semiconductor device 3. In some embodiments, a portion of the blocking layer 300 which connects the first and second semiconductor patterns 210 and 220 between the first and second semiconductor patterns 210 and 220 may further be etched such that the first and second patterns 210 and 220 may be separated. In this state, the epitaxial layer 400 may be formed through epitaxial growth on the exposed surfaces of the first and second semiconductor patterns 210 and 220 with the surfaces of the first and second semiconductor patterns 210 and 220 exposed to the outside as the base.

According to the semiconductor device 3, the first semiconductor pattern 210 and the second semiconductor pattern 220 may include the n-type impurities (e.g., phosphorus). The first semiconductor pattern 210 and the second semiconductor pattern 220 may include, e.g., SiP. However, the present inventive concept is not limited thereto. The blocking layer 300 may include the material with the relatively high-resistance to the etchant (for example, the ammonia solution), e.g., SiGe. Herein, when SiGe is included in the blocking layer 300, Ge may be provided in a range of 5 at % to 10 at %.

In addition, the capping epitaxial layer 400 may include the n-type impurities like the first and second semiconductor devices 210 and 220 and the capping epitaxial layer 400 may include the same material as the first and second semiconductor patterns 210 and 220. For example, the capping epitaxial layer 400 may also include SiP, however, the concentration of P included in the capping epitaxial layer 400 may be higher than that of P included in the first and second semiconductor patterns 210 and 220.

When the blocking layer material on the surfaces of the first and second semiconductor patterns 210 and 220 exposed to the outside (e.g., those not facing the void between the first and second semiconductor patterns 210 and 220) is removed, these surfaces of the first and second semiconductor patterns 210 and 220 exposed to the outside may be damaged. The capping epitaxial layer 400 may be formed on the first and second semiconductor patterns 210 and 220 in order to strengthen the stress characteristics.

Figure 8:
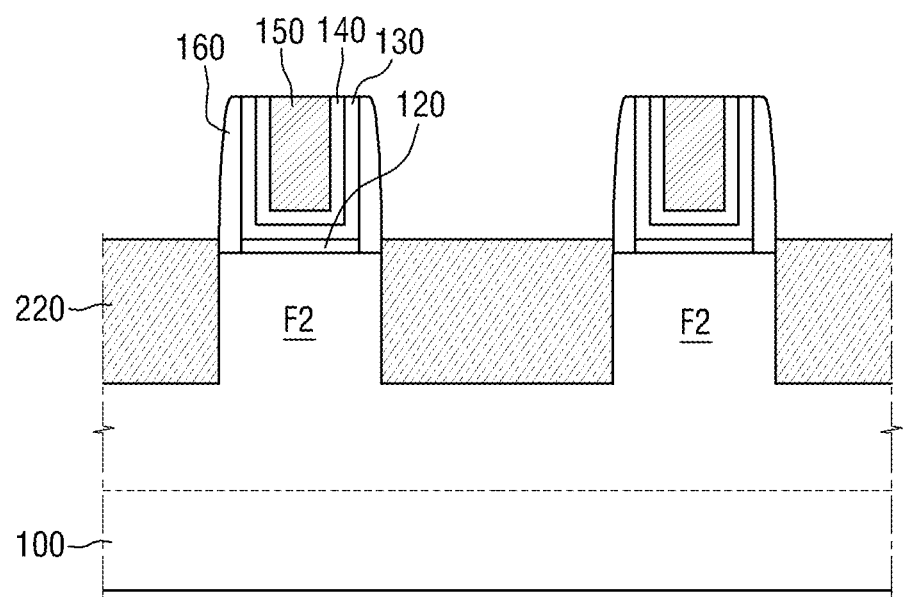
FIGS. 8 and 9 are cross-sectional views taken along lines A-A and B-B of FIG. 1, respectively, to illustrate a semiconductor device according to example embodiments of the present inventive concept.
Figure 9:
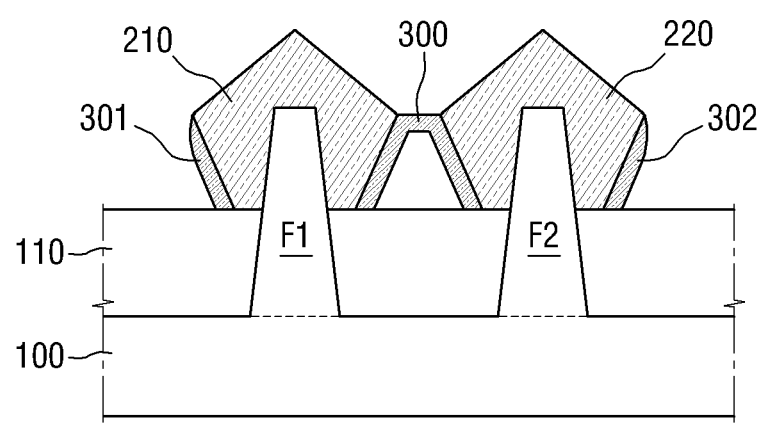

FIGS. 8 and 9 are cross-sectional views of a semiconductor device according to example embodiments of the present inventive concept. For ease of description, the description of parts which is substantially the same as the parts described in the semiconductor device 1 of FIGS. 1 to 3 according to example embodiments of the present inventive concept will be omitted.

Referring to FIGS. 8 and 9, in a semiconductor device 4 according to example embodiments of the present inventive concept, the blocking layer 300 is disposed below bottom facets (here, downwardly facing facets) of the first and second semiconductor patterns 210 and 220 between the first and second semiconductor patterns 210 and 220. A second blocking layer 301 is disposed on the bottom facet of the first semiconductor pattern 210 that is exposed to the outside, and a third blocking layer 302 is disposed on the bottom facet of the second semiconductor pattern 220 exposed to the outside.

In detail, the blocking layer is formed by epitaxially growing the surfaces of the first and second semiconductor patterns 210 and 220 as a base but without completely merging the first and second semiconductor patterns 210 and 220 and thereafter, the blocking layer on the surfaces of the first and second semiconductor patterns 210 and 220 exposed to the outside (here, those that are not facing the void between the first and second semiconductor patterns 210 and 220) are removed, however, only the blocking layer on the tops of the first and second semiconductor pattern 210 and 220 (e.g., facing in an upward direction) is removed to form the first to third blocking layers 300, 301, and 302.

In this case, the blocking layer on the upper surfaces of the first and second semiconductor patterns 210 and 220 exposed to the outside may be removed by using a dry etching process and for example, the blocking layer may be removed by using HCl and/or GeH$_4$.

According to the semiconductor device 4, the first and second semiconductor patterns 210 and 220 may include the n-type impurities (e.g., phosphorus). The first semiconductor pattern 210 and the second semiconductor pattern 220 may include, e.g., SiP. However, the present inventive concept is not limited thereto. The first to third blocking layers 300, 301, and 302 may include a semiconductor material with a relatively high-resistance to the etchant (for example, the ammonia solution), e.g., SiGe. Herein, when SiGe is included in the first to third blocking layers 300, 301, and 302, Ge may be provided in a range of 5 at % to 10 at %.

Figure 10:
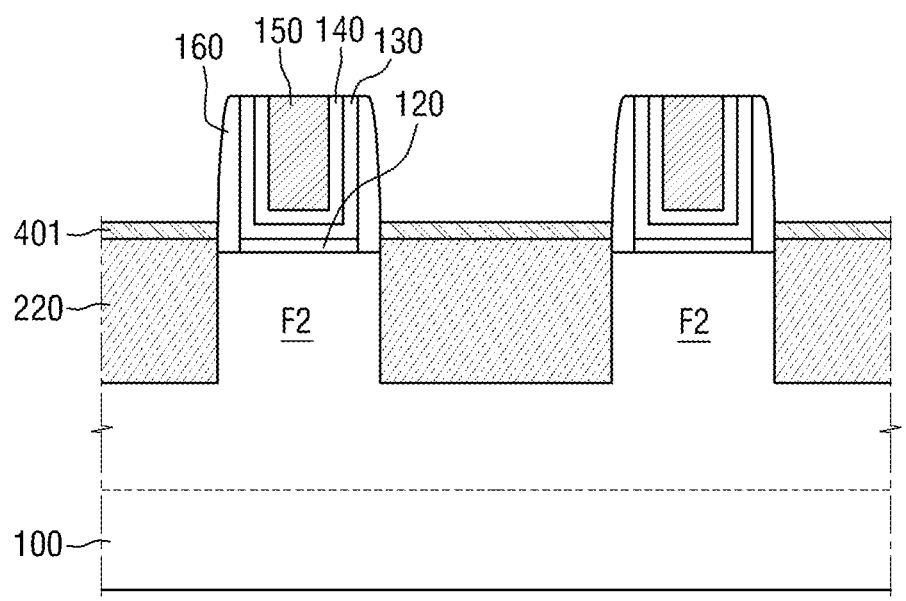
FIGS. 10 and 11 are cross-sectional views taken along lines A-A and B-B of FIG. 1, respectively, to illustrate a semiconductor device according to example embodiments of the present inventive concept.
Figure 11:
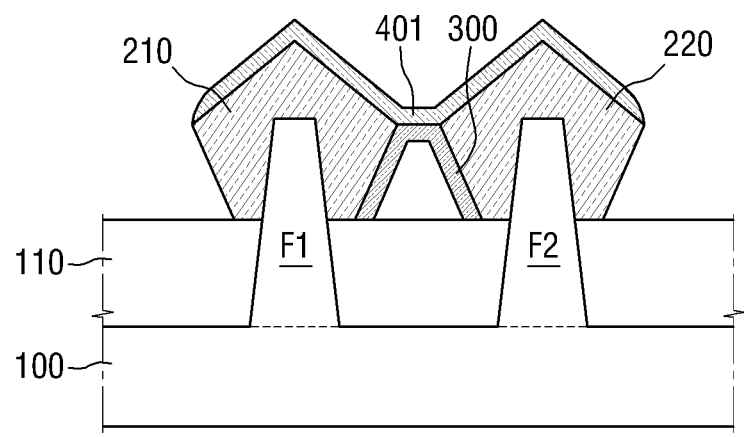

FIGS. 10 and 11 are cross-sectional views of a semiconductor device according to example embodiments of the present inventive concept. For ease of description, the description of parts which is substantially the same as the parts described in the semiconductor device 1 of FIGS. 1 to 3 according to example embodiments of the present inventive concept will be omitted.

Referring to FIGS. 10 and 11, in the semiconductor device 5 according to example embodiments of the present inventive concept, the blocking layer 300 may be disposed below bottom facets of the first and second semiconductor patterns 210 and 220 between the first and second semiconductor patterns 210 and 220. An upper pattern 401 may be disposed on only the tops of the first and second semiconductor patterns 210 and 220.

In detail, the blocking layer is formed by epitaxially growing the surfaces of the first and second semiconductor patterns 210 and 220 as a base but without completely merging the first and second semiconductor patterns 210 and 220 and thereafter, the blocking layer on the surfaces of the first and second semiconductor patterns 210 and 220 exposed to the outside are removed to form the blocking layer 300.

The upper pattern 401 may be formed on the tops of the first and second semiconductor patterns 210 and 220 (and the blocking layer) by using an atomic layer deposition (ALD) or physical vapor deposition (PVD) process.

According to the semiconductor device 5, the first and second semiconductor patterns 210 and 220 may include the n-type impurities (e.g., phosphorus). The first semiconductor pattern 210 and the second semiconductor pattern 220 may include, e.g., SiP. However, the present inventive concept is not limited thereto. The blocking layer 300 may include the material with the relatively high-resistance to the etchant (for example, the ammonia solution), e.g., SiGe. Herein, when SiGe is included in the blocking layer 300, Ge in a range of 5 at % to 10 at % may be included.

The upper pattern 401 may include the n-type impurities like the first and second semiconductor devices 210 and 220 and the upper pattern 401 may include the same material as the first and second semiconductor patterns 210 and 220. For example, the upper pattern 401 may also include SiP, however, the concentration of P included in the upper pattern 401 may be higher than that of P included in the first and second semiconductor patterns 210 and 220.

Figure 12:
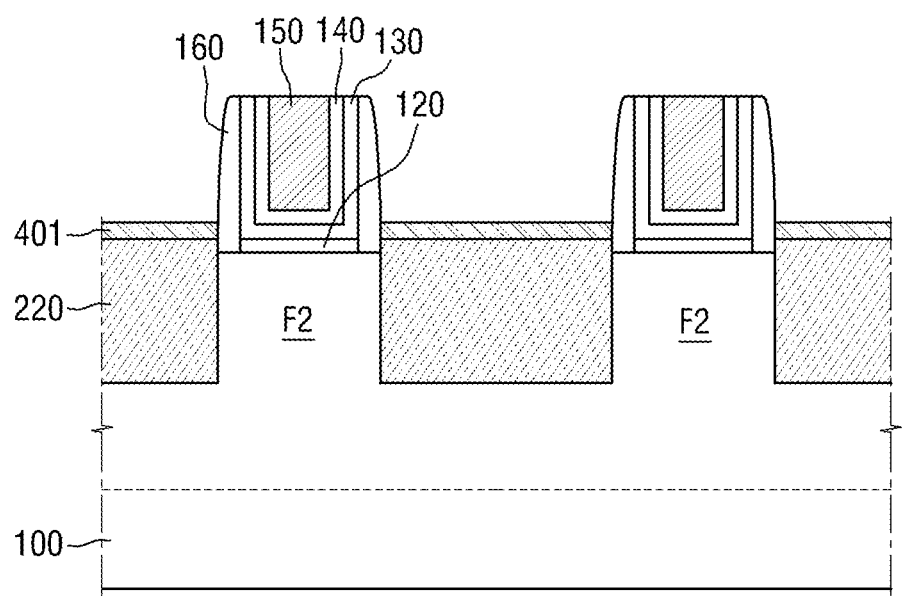
FIGS. 12 and 13 are cross-sectional views taken along lines A-A and B-B of FIG. 1, respectively, to illustrate a semiconductor device according to example embodiments of the present inventive concept.
Figure 13:
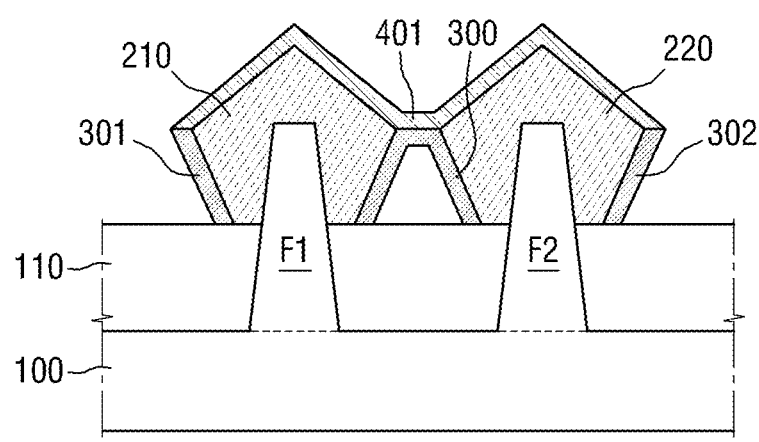

FIGS. 12 and 13 are cross-sectional views of a semiconductor device according to example embodiments of the present inventive concept. For ease of description, the description of parts which is substantially the same as the parts described in the semiconductor device 1 of FIGS. 1 to 3 according to the first embodiment of the present inventive concept will be omitted.

Referring to FIGS. 12 and 13, in a semiconductor device 6 according to example embodiments of the present inventive concept, a first blocking layer 300 is disposed below bottom facets of the first and second semiconductor patterns 210 and 220 between the first and second semiconductor patterns 210 and 220. A second blocking layer 301 is disposed on the bottom facet of the first semiconductor pattern 210 exposed to the outside, and a third blocking layer 302 is disposed on the bottom facet of the second semiconductor pattern 220 exposed to the outside.

The upper pattern 401 is disposed on the tops of the first and second semiconductor patterns 210 and 220.

In detail, the blocking layer is formed by epitaxially growing the surfaces of the first and second semiconductor patterns 210 and 220 as a base but without completely merging the first and second semiconductor patterns 210 and 220 and thereafter, the blocking layer on the surfaces of the first and second semiconductor patterns 210 and 220 exposed to the outside are removed. However, only the blocking layer on the tops of the first and second semiconductor pattern 210 and 220 is removed to form the first to third blocking layer 300, 301, and 302.

The upper pattern 401 may be formed on the tops of the first and second semiconductor patterns 210 and 220 (and the blocking layer) by using the ALD or PVD process or an epitaxial process.

According to the semiconductor device 6, the first and second semiconductor patterns 210 and 220 may include the n-type impurities (e.g., phosphorus). The first and second semiconductor patterns 210 and 220 may include, e.g., SiP. The first to third blocking layers 300, 301, and 302 may include the semiconductor material with the relatively high-resistance to the etchant (for example, the ammonia solution), e.g., SiGe. Herein, when SiGe is included in the first to third blocking layers 300, 301, and 302, Ge in a range of 5 at % to 10 at % may be included.

The upper pattern 401 may include the n-type impurities like the first and second semiconductor devices 210 and 220 and for example, the upper pattern 401 may include the same material as the first and second semiconductor patterns 210 and 220. For example, the upper pattern 401 may also include SiP. However, the concentration of P included in the upper pattern 401 may be higher than that of P included in the first and second semiconductor patterns 210 and 220.

Figure 14:
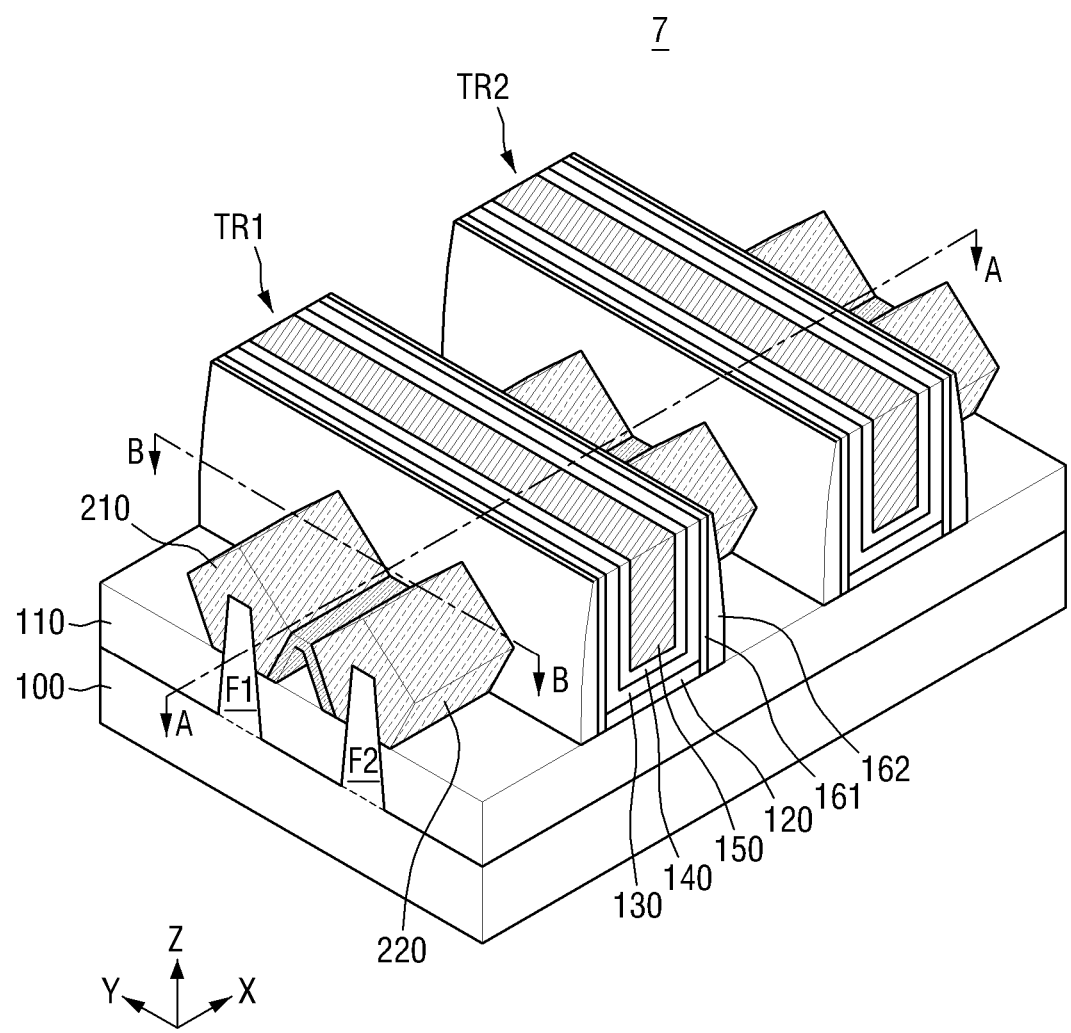
FIG. 14 is a perspective view to illustrate a semiconductor device according to example embodiments of the present inventive concept.

FIG. 14 is a perspective view of a semiconductor device according to example embodiments of the present inventive concept. For ease of description, the description of parts which is substantially the same as the parts described in the semiconductor device 1 of FIGS. 1 to 3 according to the first embodiment of the present inventive concept will be omitted.

Referring to FIG. 14, in a semiconductor device 7 according to the example embodiments of the present inventive concept, the first gate structure TR1 may include the interface layer 120, the gate insulating layer 130, the work function control layer 140, the gate metal 150, a dummy gate spacer 161, and a normal gate spacer 162, which are sequentially formed on the first and active fins F1 and F2.

In the semiconductor device 7, the second gate structure TR2 may include substantially the same configuration as the first gate structure TR1.

The interface layer 120, the gate insulating layer 130, the work function control layer 140, and the gate metal 150 are described substantially the same as described above. In some embodiments, the interface layer 120 and the dummy gate spacer 161 may be not formed.

In fabricating the semiconductor device 7, the dummy gate structure may be formed and thereafter, the dummy gate spacer 161 and the normal gate spacer 162 may be formed on the dummy gate structure, and the first semiconductor pattern 210, the second semiconductor pattern 220, and the blocking layer 300 may be formed. The dummy gate structure may be removed and thereafter, the gate structure (e.g., first gate structure TR1 and second structure TR2) may be formed. The gate structure may be a real gate structure. In this case, the dummy gate spacer 161 may remain after the dummy gate structure is removed. The normal gate spacer 162 is formed in order to insulate the first and second semiconductor patterns 210 and 220 and the gate structure (e.g., first gate structure TR1 and second structure TR2).

Figure 15:
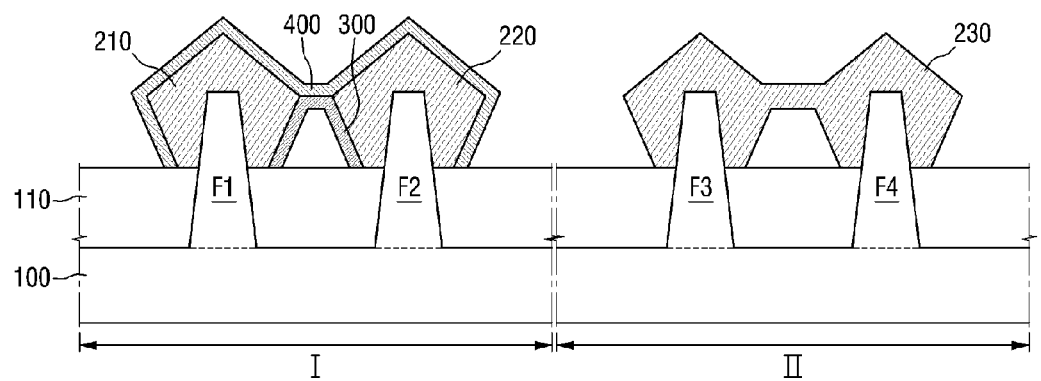
FIG. 15 is a cross-sectional view to illustrate a semiconductor device according to example embodiments of the present inventive concept.

FIG. 15 is a cross-sectional view of a semiconductor device according to example embodiments of the present inventive concept. For ease of description, description of parts which is substantially the same as the parts described in the semiconductor device 1 of FIGS. 1 to 3 according to example embodiments of the present inventive concept will be omitted.

Referring to FIG. 15, the semiconductor device 8 according to example embodiments of the present inventive concept includes the substrate 100 in which the first region I and the second region II are defined.

The first and second active fins F1 and F2 are formed on the first region I of the substrate 100. The first and second active fins F1 and F2 may be formed to protrude from the substrate 100.

The first active fin F1 and the second active fin F2 may be parts of the substrate 100 and include the epitaxial layer, which is grown from the substrate 100.

The field insulating layer 110 may cover the tops of the substrate 100 and parts of the sides of the first and second active fins F1 and F2.

The first semiconductor pattern 210 may be formed on the first active fin F1. The first semiconductor pattern 210 may be formed on the first active fin F1 by using the selective epitaxial growth (SEG) process.

Alternatively, the first semiconductor pattern 210 is formed to fill a recess, formed from at least a part of the first active fin F1. The first semiconductor pattern 210 may in such a case be formed by using the SEG process.

The second semiconductor pattern 220 is formed on the second active fin F2. The second semiconductor pattern 220 may be formed on the second active fin F2 by using the SEG process.

Alternatively, the second semiconductor pattern 220 may be formed by filling a recess, formed from at least a part of the second active fin F2. The second semiconductor pattern 220 may in such a case be formed by using the SEG process.

The blocking layer 300 may be disposed below the bottom facets of the first and second semiconductor patterns 210 and 220 between the first and second semiconductor patterns 210 and 220, and the epitaxial layer 400 may be disposed on the surfaces of the first and second semiconductor patterns 210 and 220 exposed to the outside.

The blocking layer is formed by epitaxially growing the surfaces of the first and second semiconductor patterns 210 and 220 as a base but without completely merging the first and second semiconductor patterns 210 and 220 and thereafter, the blocking layer on the surfaces of the first and second semiconductor patterns 210 and 220 exposed to the outside are removed to form the blocking layer 300 in the semiconductor device 8. In this state, the epitaxial layer 400 may be formed on the surfaces of the first and second semiconductor patterns 210 and 220 by epitaxially growing the surfaces of the first and second semiconductor patterns 210 and 220 exposed to the outside as the base.

According to the semiconductor device 8, the first region I may be the NMOS region and the first and second semiconductor patterns 210 and 220 may include the n-type impurities. The first and second semiconductor patterns 210 and 220 may be, e.g., SiP. However, the present inventive concept is not limited thereto. The blocking layer 300 may include the material with the relatively high-resistance to the etchant (for example, the ammonia solution), e.g., SiGe. Herein, when SiGe is included in the blocking layer 300, Ge in a range of 5 at % to 10 at % may be included.

The epitaxial layer 400 may include the n-type impurities like the first and second semiconductor devices 210 and 220 and for example, the epitaxial layer 400 may include the same material as the first and second semiconductor patterns 210 and 220. For example, the epitaxial layer 400 may also include SiP, however, the concentration of P included in the epitaxial layer 400 may be higher than that of P included in the first and second semiconductor patterns 210 and 220.

When the blocking layer material on the surfaces of the first and second semiconductor patterns 210 and 220 exposed to the outside are removed, the surfaces of the first and second semiconductor patterns 210 and 220 exposed to the outside may be damaged. The epitaxial layer 400 may be formed on the first and second semiconductor patterns 210 and 220 in order to strengthen the tensile stress characteristics.

A third active fin F3 and a fourth active fin F4 may be formed on the second region II of the substrate 100. The third and fourth active fins F3 and F4 may be formed to protrude from the substrate 100.

The third and fourth active fins F3 and F4 may be parts of the substrate 100 and include the epitaxial layer, which is grown from the substrate 100.

The field insulating layer 110 may cover the top of the substrate 100 and parts of sides of the third and fourth active fins F3 and F4.

A third semiconductor pattern 230 is formed on the third and fourth active fins F3 and F4. The third semiconductor pattern 230 may be formed on the third and fourth active fins F3 and F4 by using the selective epitaxial growth (SEG) process.

The third semiconductor pattern 230 may include, for example, the same material as the blocking layer 300. The second region II may be, for example, the PMOS region and the third semiconductor pattern 230 may include p-type impurities (e.g., boron). The third semiconductor pattern 230 may include, e.g., SiGe.

Figure 16:
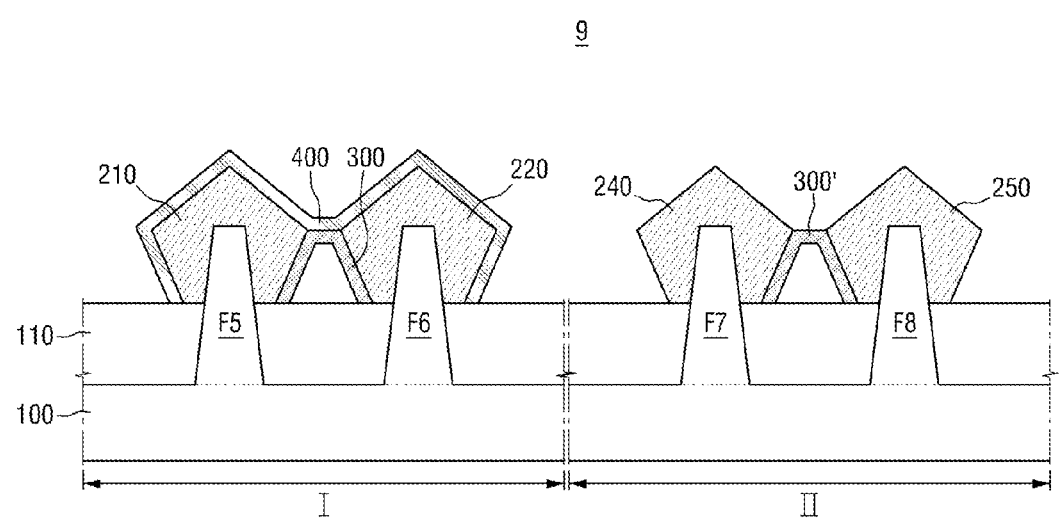
FIG. 16 is a cross-sectional view to illustrate a semiconductor device according to example embodiments of the present inventive concept.

FIG. 16 is a cross-sectional view of a semiconductor device according to example embodiments of the present inventive concept. For ease of description, a description of parts which is substantially the same as the parts described in the semiconductor device 1 of FIGS. 1 to 3 according to example embodiments of the present inventive concept will be omitted.

Referring to FIG. 16, a semiconductor device 9 according to example embodiments of the present inventive concept includes the substrate 100 in which the first region I and the second region II are defined.

A fifth active fin F5 and a sixth active fin F6 are formed on the first region I of the substrate 100. The fifth active fin F5 and the sixth active fin F6 may be formed to protrude from the substrate 100.

The fifth and sixth active fins F5 and F6 may be parts of the substrate 100 and include the epitaxial layer, which is grown from the substrate 100.

The field insulating layer 110 may cover the top of the substrate 100 and parts of sides of the fifth and sixth active fins F5 and F6.

The first semiconductor pattern 210 may be formed on the fifth active fin F5. The first semiconductor pattern 210 may be formed on the fifth active fin F5 by using the selective epitaxial growth (SEG) process.

Alternatively, the first semiconductor pattern 210 may be formed to fill a recess, formed from at least a part of the fifth active fin F5. The first semiconductor pattern 210 may in such a case be formed by using the SEG process.

The second semiconductor pattern 220 may be formed on the sixth active fin F6. The second semiconductor pattern 220 may be formed on the sixth active fin F6 by using the SEG process.

Alternatively, the second semiconductor pattern 220 may be formed by filling a recess, formed from at least a part of the sixth active fin F6. The second semiconductor pattern 220 may in such a case be formed by using the SEG process.

The blocking layer 300 is disposed below bottom facets of the first and second semiconductor patterns 210 and 220 between the first and second semiconductor patterns 210 and 220. The epitaxial layer 400 may be disposed on the surfaces of the first and second semiconductor patterns 210 and 220 exposed to the outside.

The blocking layer may be formed by epitaxially growing the surfaces of the first and second semiconductor patterns 210 and 220 as a base but without completely merging the first and second semiconductor patterns 210 and 220 and thereafter, the blocking layer on the surfaces of the first and second semiconductor patterns 210 and 220 exposed to the outside are removed to form the blocking layer 300 in the semiconductor device 8. In this state, the capping epitaxial layer 400 may be formed by epitaxially growing the surfaces of the first and second semiconductor patterns 210 and 220 exposed to the outside as the base, on the surfaces of the first and second semiconductor patterns 210 and 220 exposed to the outside.

According to the semiconductor device 9, the first and second semiconductor patterns 210 and 220 may include the n-type impurities (e.g., phosphorus). The first and second semiconductor patterns 210 and 220 may include, e.g., SiP. However, the present inventive concept is not limited thereto. The blocking layer 300 may include the material with the relatively high-resistance to the etchant (for example, the ammonia solution), e.g., SiGe. Herein, when SiGe is included in the blocking layer 300, Ge in a range of 5 at % to 10 at % may be included.

The capping epitaxial layer 400 may include the n-type impurities like the first and second semiconductor devices 210 and 220 and for example, the capping epitaxial layer 400 may include the same material as the first and second semiconductor patterns 210 and 220. For example, the capping epitaxial layer 400 may also include SiP. However, the concentration of P included in the capping epitaxial layer 400 may be higher than that of P included in the first and second semiconductor patterns 210 and 220.

A seventh active fin F7 and an eighth active fin F8 are formed on the second region II of the substrate 100. The seventh and eighth active fins F7 and F8 may be formed to protrude from the substrate 100.

The seventh and eighth active fins F7 and F8 may be parts of the substrate 100 and include the epitaxial layer, which is grown from the substrate 100.

The field insulating layer 110 may cover the top of the substrate 100 and parts of sides of the seventh and eighth active fins F7 and F8.

A fourth semiconductor pattern 240 is formed on the seventh active fin F7 and a fifth semiconductor pattern 250 is formed on the eighth active fin F8. In detail, the fourth and fifth semiconductor patterns 240 and 250 may be formed on the seventh and eighth active fins F7 and F8 by using the selective epitaxial growth (SEG) process, respectively.

The fourth and fifth semiconductor patterns 240 and 250 may include the n-type impurities (e.g., phosphorus). The fourth and fifth semiconductor patterns 240 and 250 may include, e.g., SiP. However, the present inventive concept is not limited thereto. A blocking layer 300' is disposed below bottom facets of the fourth and fifth semiconductor patterns 240 and 250 between the fourth and fifth semiconductor patterns 240 and 250, in the second region II.

The blocking layer 300' may include, e.g., SiGe.

Figure 17:
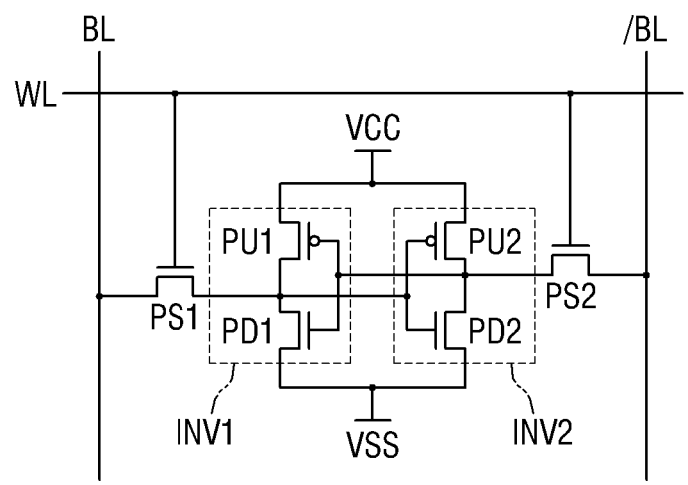
FIGS. 17 to 19 are a circuit diagram and a layout diagram for describing a semiconductor device according to example embodiments of the present inventive concept.
Figure 18:
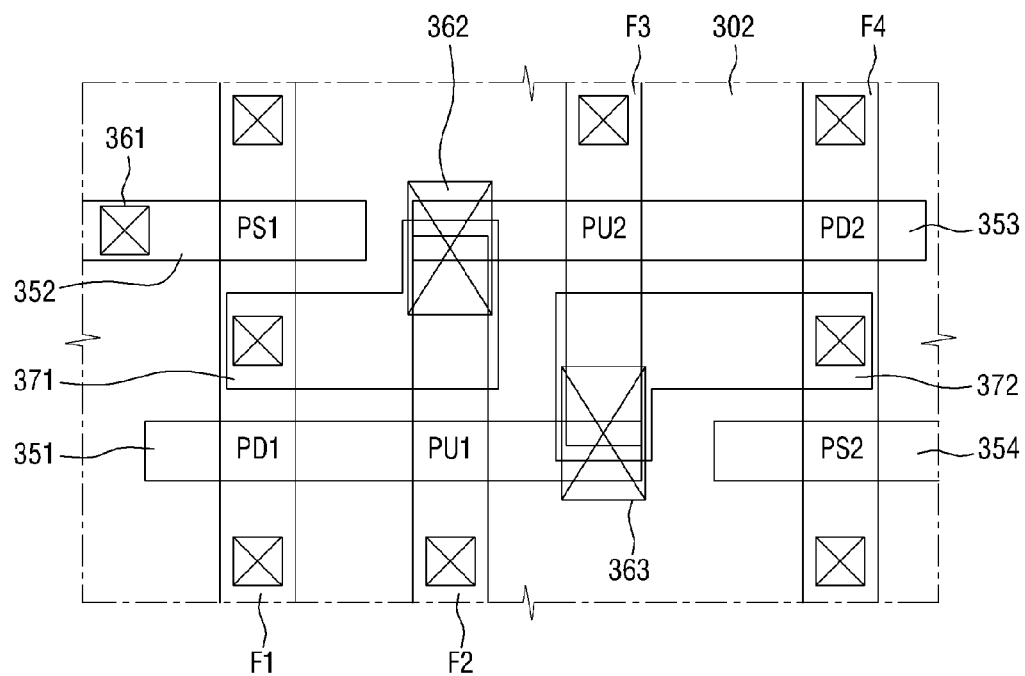
Figure 19:
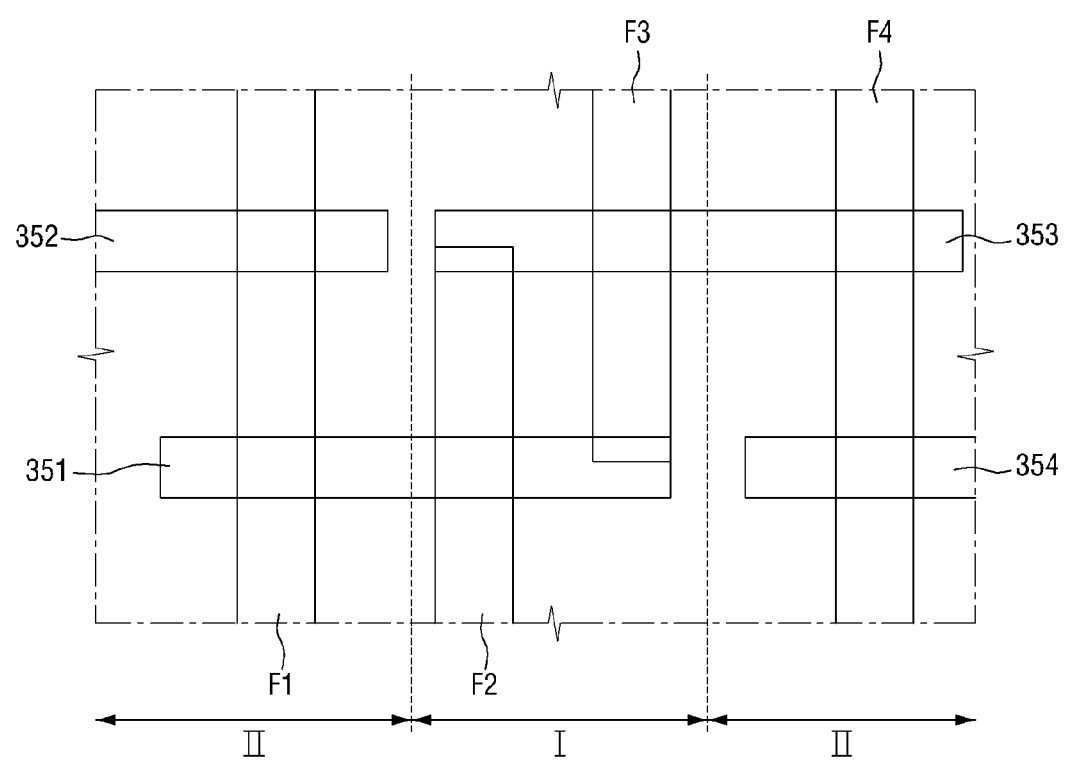

FIGS. 17 to 19 are a circuit diagram and a layout diagram for describing a semiconductor device according to example embodiments of the present inventive concept.

FIGS. 17 to 18 are a circuit diagram and a layout diagram, respectively, for describing a semiconductor device according to example embodiments of the present inventive concept. FIG. 19 illustrates only a plurality of fins and a plurality of gate structures, in the layout diagram of FIG. 18. The semiconductor devices 1 to 9 of the present disclosure may be applied to all devices constituted by logic elements using a fin-type transistor, but FIGS. 17 to 19 illustrate an SRAM as a particular example.

Referring to FIG. 17, the semiconductor device according to example embodiments of the present inventive concept may include a pair of inverters INV1 and INV2 connected in parallel between a power node Vcc and a ground node Vss. The embodiment may also include a first pass transistor PS1 and a second pass transistor PS2 connected to output nodes of the inverters INV1 and INV2, respectively.

The first pass transistor PS1 and the second pass transistor PS2 may be connected in-line with a bit line BL and a complementary bit line /BL, respectively. Gates of the first pass transistor PS1 and the second pass transistor PS2 may each be connected to a word line WL.

The first inverter INV1 includes a first pull-up transistor PU1 and a first pull-down transistor PD1, which are connected to each other in series, and the second inverter INV2 may include a second pull-up transistor PU2 and a second pull-down transistor PD2, which are connected to each other in series.

The first pull-up transistor PU1 and the second pull-up transistor PU2 are PMOS transistors, and the first pull-down transistor and the second pull-down transistor PD2 are NMOS transistors.

In order that the first inverter INV1 and the second inverter INV2 configure one latch circuit, an input node of the first inverter INV1 may be connected with an output node of the second inverter INV2, and an input node of the second inverter INV2 may be connected with an output node of the first inverter INV1.

Referring to FIGS. 18 and 19, a first fin F1, a second fin F2, a third fin F3, and a fourth fin F4 which are spaced apart from each other may be formed to extend in one direction (for example, a vertical direction of FIG. 18). The second and third fins F2 and F3 may have smaller lengths than the first and fourth fins F1 and F4.

A first gate structure 351, a second gate structure 352, a third gate structure 353, and a fourth gate structure 354 extend in the other direction (for example, a horizontal direction of FIG. 18), and are formed in a direction crossing the first to fourth fins F1 to F4.

The first gate structure 351 completely crosses the first fin F1 and the second fin F2, and may partially overlap with an end of the third fin F3. The third gate structure 353 completely crosses the fourth fin F4 and the third fin F3 and may partially overlap with an end of the second fin F2. The second gate electrode 352 and the fourth gate structure 354 may be formed to cross the first and fourth fins F1 and F4, respectively.

As illustrated in FIG. 18, the first pull-up transistor PU1 is defined around an area in which the first gate structure 351 and the second fin F2 cross each other, the first pull-down transistor PD1 is defined around an area in which the first gate electrode 351 and the first fin F1 cross each other, and the first pass transistor PS1 may be defined around an area in which the second gate structure 352 and the first fin F1 cross each other.

The second pull-up transistor PU2 is defined around an area in which the third gate structure 353 and the third fin F3 cross each other, the second pull-down transistor PD2 is defined around an area in which the third gate structure 353 and the fourth fin F4 cross each other, and the second pass transistor PS2 may be defined around an area in which the fourth gate structure 354 and the fourth fin F4 cross each other.

Source/drains may be formed at both sides of the areas where the first to fourth gate structures 351 to 354 and the first to fourth fins F1 to F4 cross each other, (e.g., in regions vertically above and below the areas where the first to fourth gate structures 351 to 354 cross the fins F1 to F4). In some embodiments, recesses may be formed at both sides of the areas where the first to fourth gate structures 351 to 354 and the first to fourth fins F1 to F4 cross each other, and the source/drains may be formed in these recesses. A plurality of contacts 361 may be formed.

A shared contact 362 may simultaneously connect the second fin F2, the third gate structure 353, and a wire 371. The shared contact 363 may simultaneously connect the third fin F3, the first gate structure 351, and a wire 372.

The first pull-up transistor PU1, the first pull-down transistor PD1, the first pass transistor PS1, the second pull-up transistor PU2, the second pull-down transistor PD2, and the second pass transistor PS2 may respectively adopt, for example, the semiconductor devices 1 to 9 according to the embodiments described above, including adoptions respective of the first and second regions I and II described above.

Hereinafter, a method for fabricating a semiconductor device according to some embodiments of the present inventive concept will be described.

Figure 20:
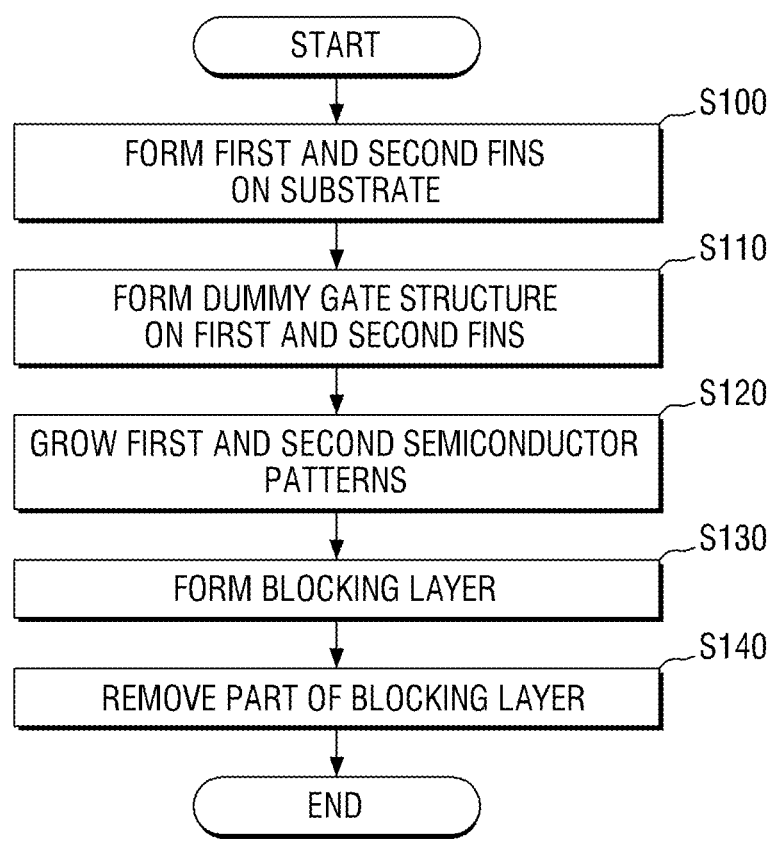
FIG. 20 is a flowchart sequentially illustrating a method for fabricating a semiconductor device according to an example embodiment of the present inventive concept.
Figure 21:
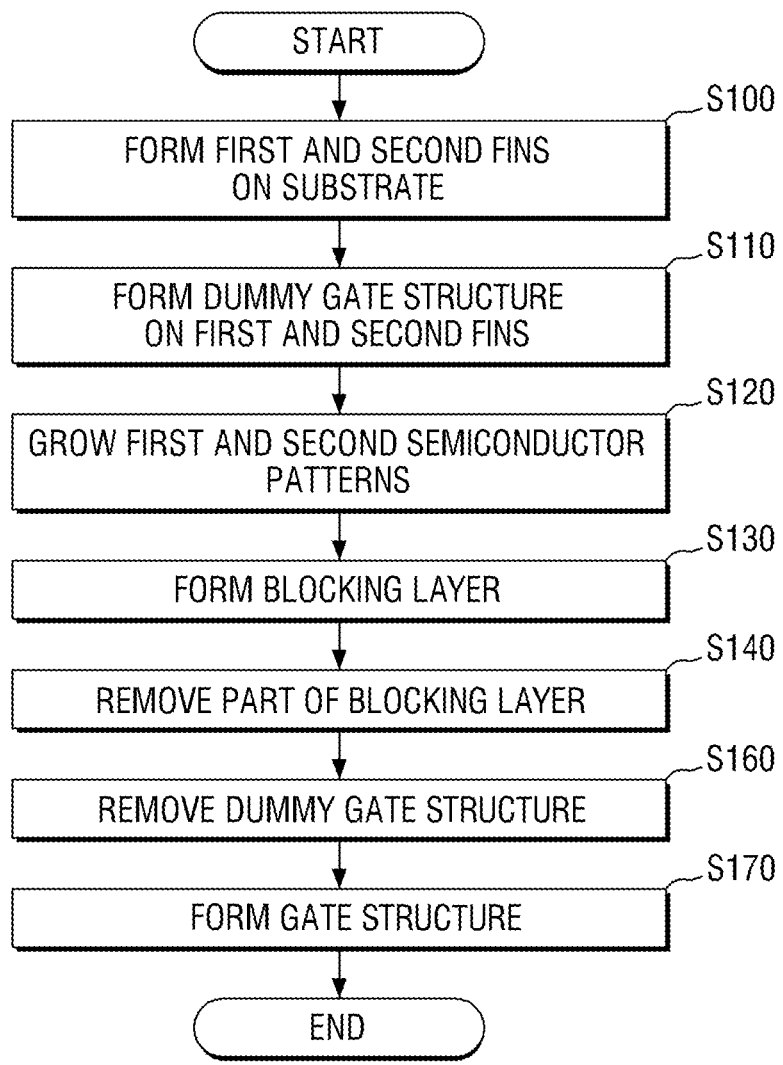
FIG. 21 is a flowchart sequentially illustrating a method for fabricating a semiconductor device according to another example embodiment of the present inventive concept.
Figure 22:
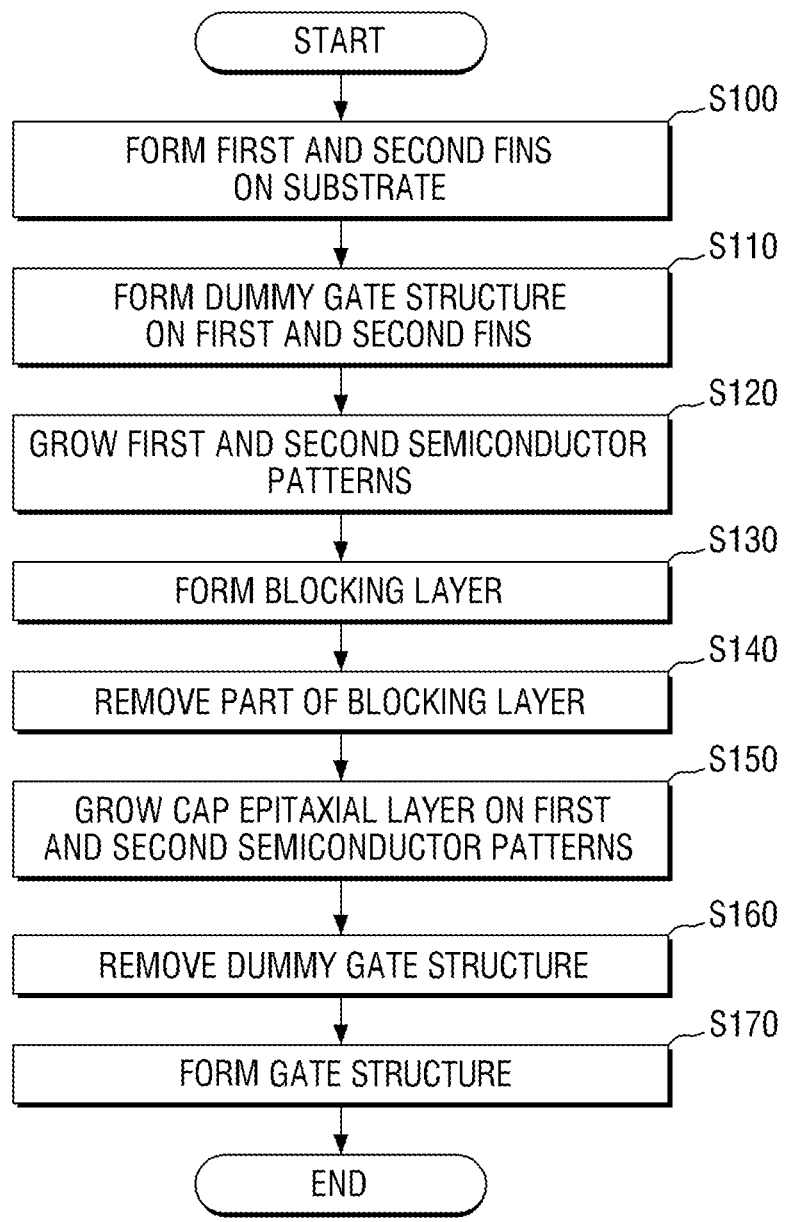
FIG. 22 is a flowchart sequentially illustrating a method for fabricating a semiconductor device according to yet another example embodiment of the present inventive concept.
Figure 23:
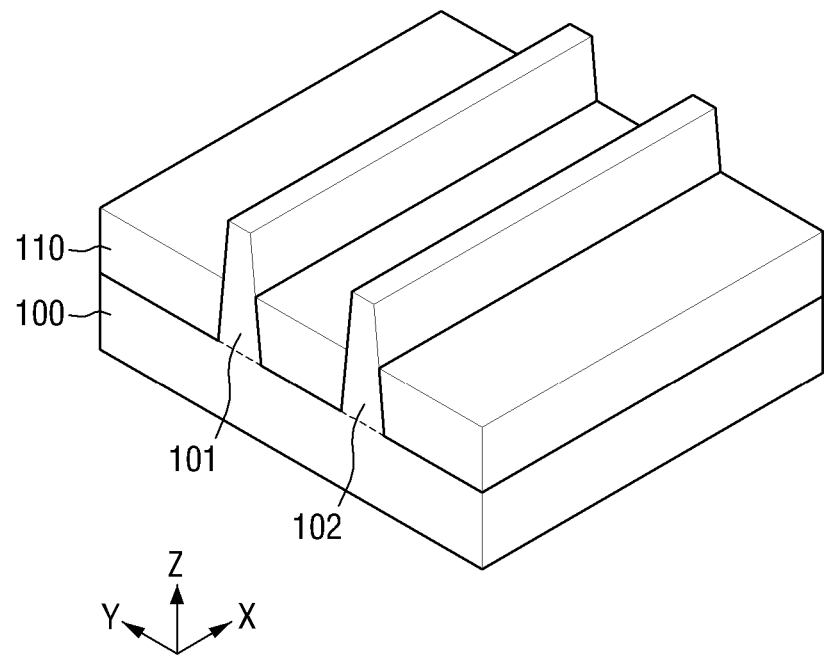
FIGS. 23 to 31 are diagrams of intermediate steps for describing a method for fabricating a semiconductor device according to example embodiments of the present inventive concept.
Figure 24:
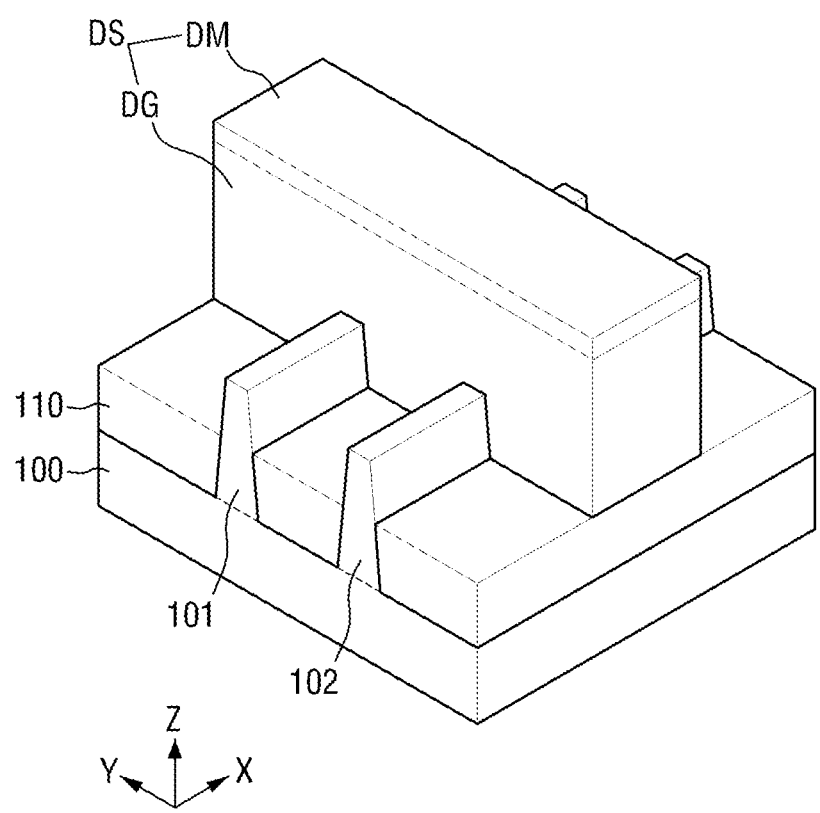
Figure 25:
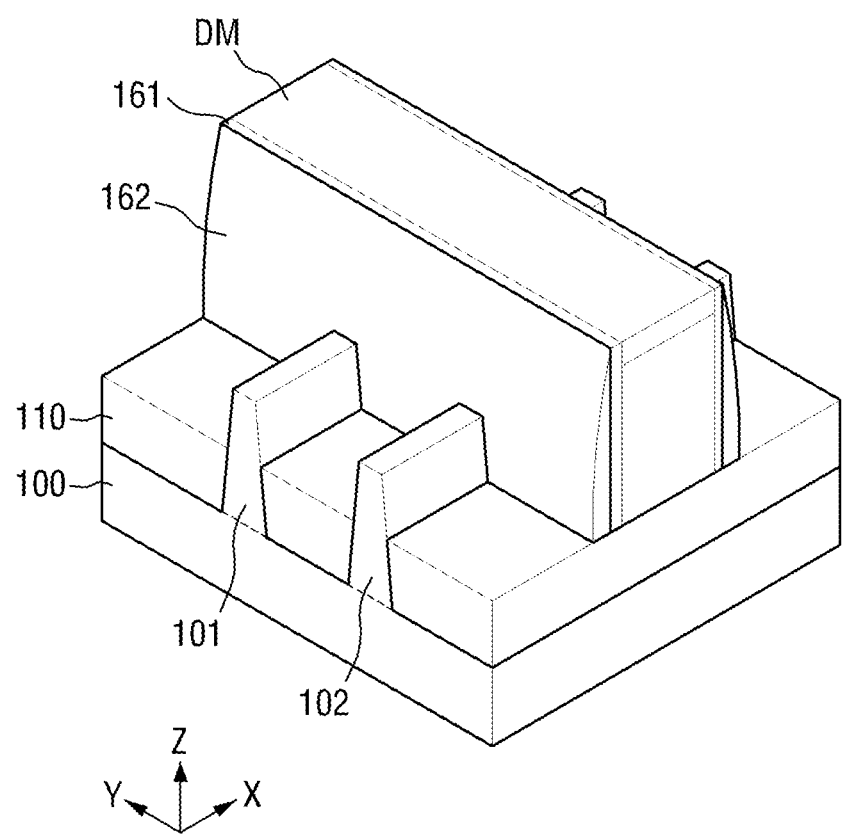
Figure 26:
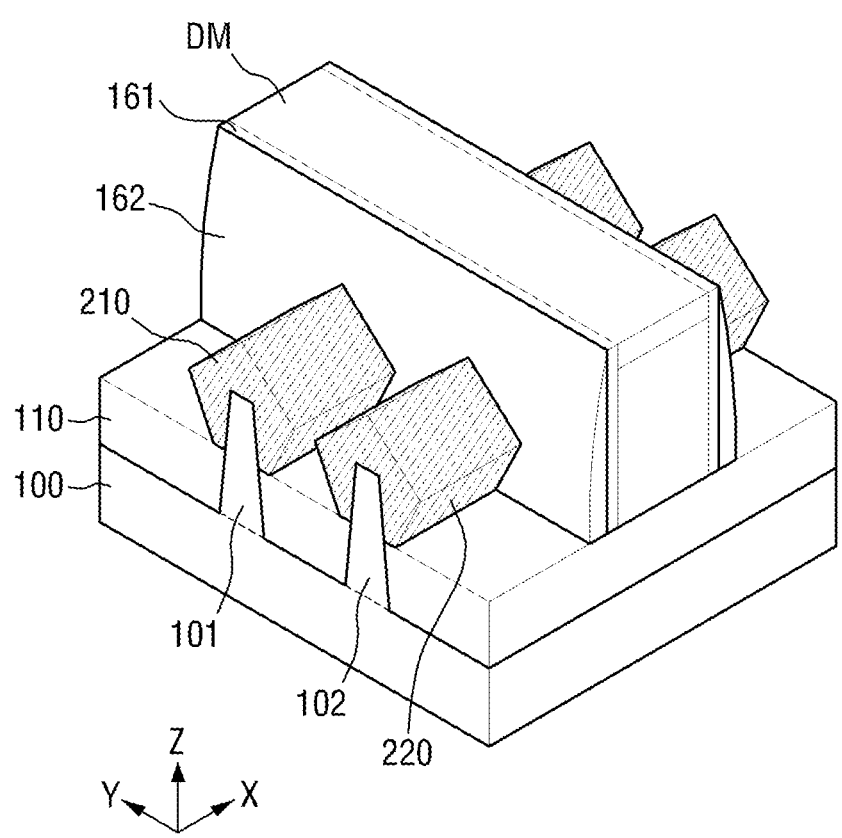
Figure 27:
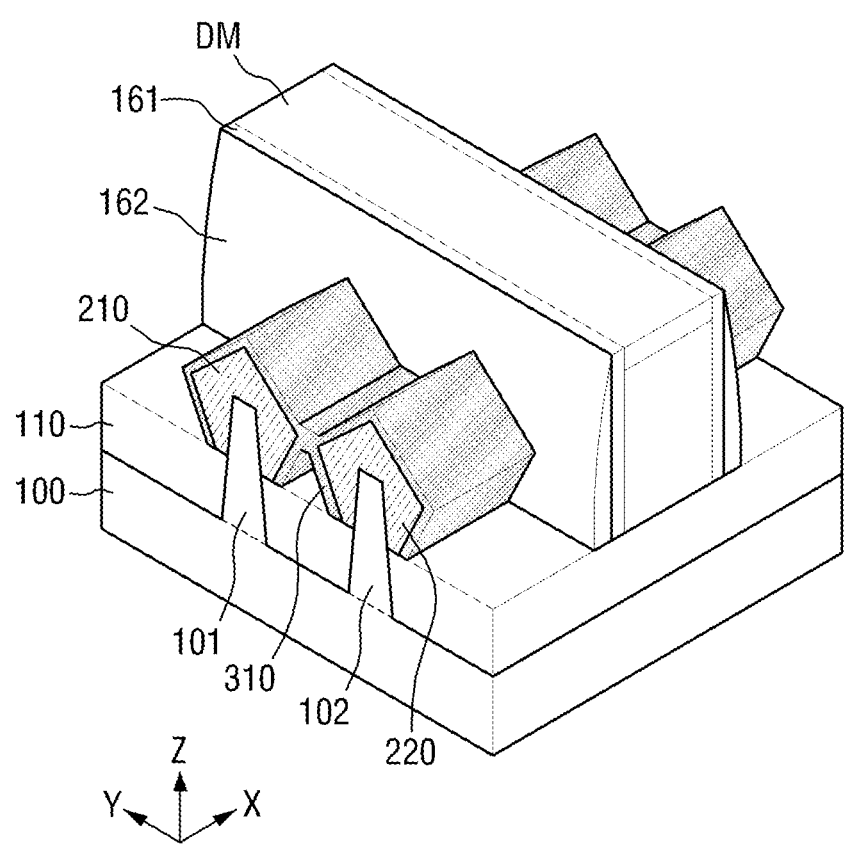

FIG. 20 is a flowchart sequentially illustrating a method for fabricating a semiconductor device according to an example embodiment of the present inventive concept. FIG. 21 is a flowchart sequentially illustrating a method for fabricating a semiconductor device according to another example embodiment of the present inventive concept. FIG. 22 is a flowchart sequentially illustrating a method for fabricating a semiconductor device according to yet another example embodiment of the present inventive concept. FIGS. 23 to 31 are diagrams of intermediate steps for describing a method for fabricating a semiconductor device according to example embodiments of the present inventive concept.

Referring to FIGS. 20, 21, 22 and 23, in the method for fabricating a semiconductor device according to the embodiment of the present inventive concept, first and second fins 101 and 102 that extend in a first direction X may be formed on a substrate 100 (S100). The first and second active fins 101 and 102 may be formed to protrude from the substrate 100.

The first and second fins 101 and 102 may be parts of the substrate 100 and each include an epitaxial layer, which is grown from the substrate 100.

The first and second fins 101 and 102 may extend in the first direction X. The field insulating layer 110 may cover the top of the substrate 100 and parts of the sides of the first and second fins 101 and 102.

Subsequently, referring to FIGS. 20, 21, 22, and 24, a dummy gate structure DS that extends in a second direction Y may be formed on the first and second fins 101 and 102 (S110). The dummy gate structure DS may include a dummy gate DG and a capping mask pattern DM thereon. The dummy gate structure DS may further include an dummy gate insulating layer between a dummy gate DG and the first and second fins 101 and 102.

Subsequently, referring to FIGS. 20, 21, 22, 25 and 26, a dummy gate spacer 161 and a normal gate spacer 162 may be formed at least at one side of the dummy gate structure DS, a first semiconductor pattern 210 may be epitaxially grown on the first fin 101, and a second semiconductor fin 220 may be epitaxially grown on the second fin 102 (S120). In this case, the first and second semiconductor patterns 210 and 220 are grown up and out such that both patterns near each other but do not contact each other. In some embodiments, after the normal gate spacer 162 may be formed, portions of the first and second fins 101 and 102 at both sides of the dummy gate structure DS may be recessed, and the first semiconductor pattern 210 may be epitaxially grown on the recessed portion of the first fin 101, and a second semiconductor fin 220 may be epitaxially grown on the recessed portion of the second fin 102. In some embodiments, the dummy gate spacer 161 may be not formed.

Referring to FIGS. 20, 21, 22, and 27, a first blocking layer 310 may be formed on the first and second semiconductor patterns 210 and 220 (S130). In this case, the first blocking layer 310 may be formed to entirely cover the external surfaces of the first and second semiconductor patterns 210 and 220.

The first blocking layer 310 may merge (or connect) the first and second semiconductor patterns 210 and 220, and be formed on the bottoms of the first and second semiconductor patterns 210 and 220 to protect the first and second semiconductor patterns 210 and 220.

The first blocking layer 310 may be formed by epitaxially growing the surfaces of the first and second semiconductor patterns 210 and 220 as a base but without completely merging the first and second semiconductor patterns 210 and 220.

The first and second semiconductor patterns 210 and 220 may include n-type impurities (e.g., phosphorus). The first and second semiconductor patterns 210 and 220 may include, e.g., SiP. In some embodiments, the first and second semiconductor patterns 210 and 220 may include SiC and/or SiCP. The first and second semiconductor patterns 210 and 220 may serve as source/drain regions. The first blocking layer 310 may include a semiconductor material with a relatively high-resistance to the etchant (for example, the ammonia solution), e.g., SiGe. Herein, when SiGe is included in the first blocking layer 310, Ge in a range of 5 at % to 10 at % may be included.

Figure 28:
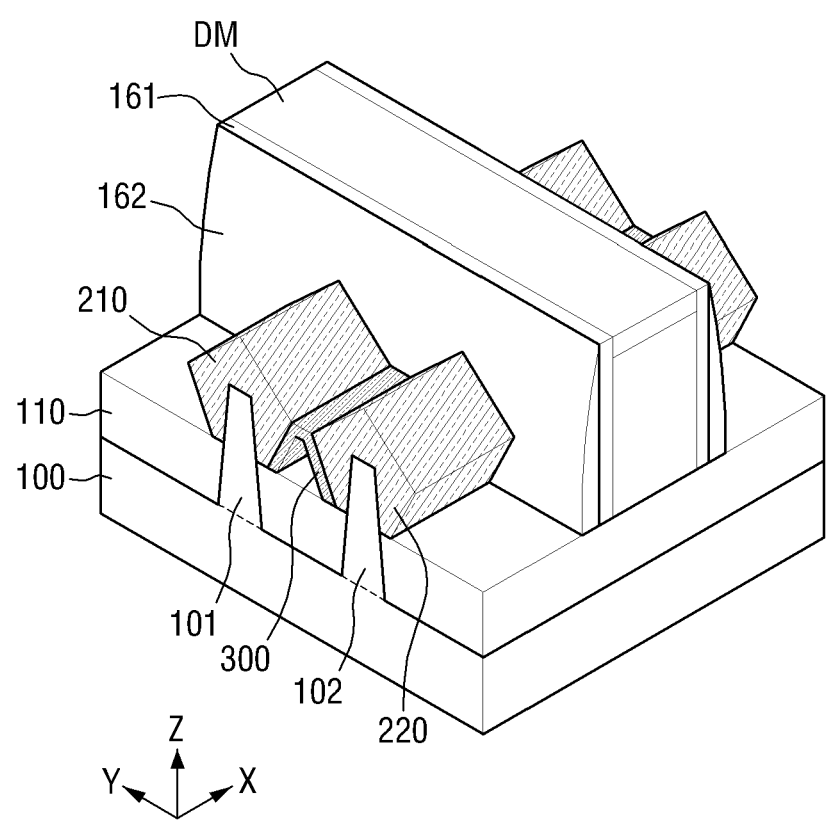

Referring to FIGS. 21, 22 and 28 the method for fabricating a semiconductor device according to another embodiment of the present inventive concept further includes forming a second blocking layer 300 by removing a part of the first blocking layer 310 (S140) The second blocking layer 300 may be formed to be disposed below bottom facets of the first and second semiconductor patterns 210 and 220 between the first and second semiconductor patterns 210 and 220. In some embodiments, the blocking layer 300 on the bottom facet of the semiconductor pattern 210 and the blocking layer 300 on the bottom facet of the second semiconductor pattern 220 may be formed discontinuously (not as a single continuous layer) by removal of the part of the first blocking layer 310.

In this case, a part of the first blocking layer 310 may be removed by using HCl and/or GeH$_4$.

One reason that the second blocking layer 300 is formed by removing a part of the first blocking layer 310 is to strengthen tensile stress characteristics of the first and second semiconductor patterns 210 and 220. That is, SiP (or SiC or SiCP) is included in the first and second semiconductor patterns 210 and 220 to apply tensile stress to a channel region and the reason is that the first blocking layer 310 includes SiGe, which degrades the tensile stress characteristics of the first and second semiconductor patterns 210 and 220.

Figure 29:
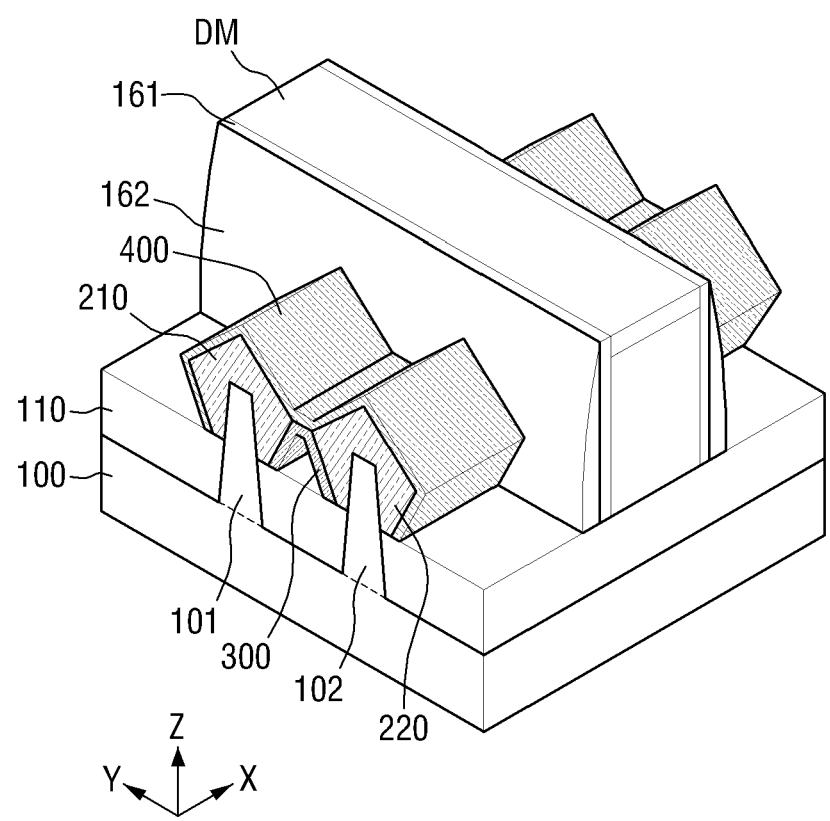

Referring to FIGS. 22 and 29, the method for fabricating a semiconductor device according to yet another embodiment of the present inventive concept may further include forming a capping epitaxial layer 400 on the first and second semiconductor patterns 210 and 220. The capping epitaxial layer 400 may be on the first and second semiconductor patterns 210 and 220 and an uppermost portion of the second blocking layer 300. The capping epitaxial layer 400 may merge (or connect) the first and second semiconductor patterns 210 and 220.

When parts of the first blocking layer 310 on the surfaces of the first and second semiconductor patterns 210 and 220 exposed to the outside are removed, the surfaces of the first and second semiconductor patterns 210 and 220 exposed to the outside may be damaged. The capping epitaxial layer 400 may be formed on the first and second semiconductor patterns 210 and 220 in order to strengthen the tensile stress characteristics. Therefore, the capping epitaxial layer 400 may include the same material as the first and second semiconductor patterns 210 and 220. The capping epitaxial layer 400 may include n-type impurities (e.g., phosphorous). The concentration of P included in the capping epitaxial layer 400 may be higher than that of P included in the first and second semiconductor patterns 210 and 220.

Subsequently, referring to FIGS. 20, 21, 22, and 30, the dummy gate structure DS may be removed (S160). An opening DO may be formed by removal of the dummy gate structure DS. In some embodiments, the formation of the opening DO may include forming an interlayer insulating layer covering the first and second semiconductor pattern 210 and 220 with the capping epitaxial layer 400 and exposing the dummy gate structure DS and removing the dummy gate structure DS to form the opening DO.

Figure 30:
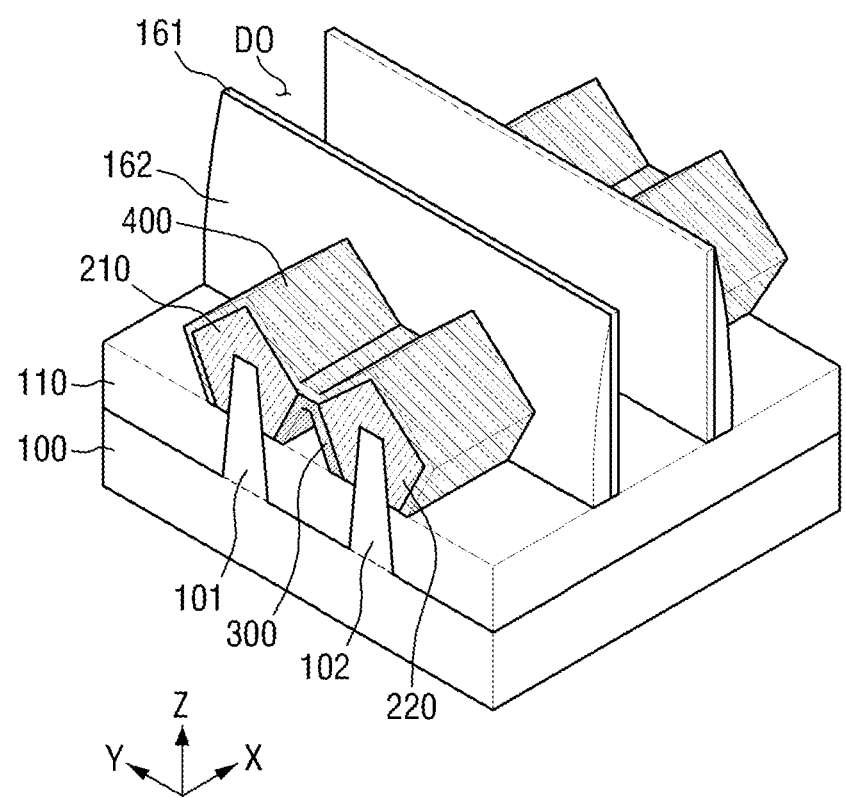
Figure 31:
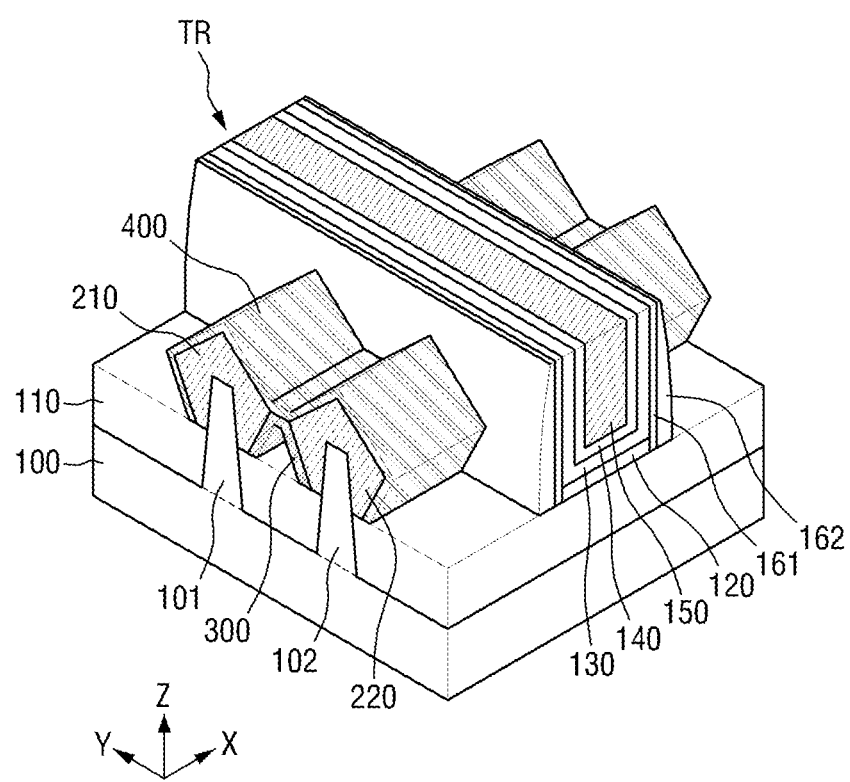

Referring to FIGS. 21, 22, and 30, a gate structure TR may be formed (170). The gate structure TR may be formed in the opening DO. The gate structure TR may be a real gate structure. The gate structure TR may include an interface layer 120, a gate insulating layer 130, a work function control layer 140, and a gate metal 150 which are sequentially formed in the opening. The gate structure TR may further include the dummy gate spacer 161 and the normal gate spacer 162. The gate structure TR may be formed on the first and second fins 101 and 102 and cross the first and second fins 101 and 102. The gate structure TR may extend in the second direction Y. In some embodiments, the interface layer 130 may be not formed.

Figure 32:
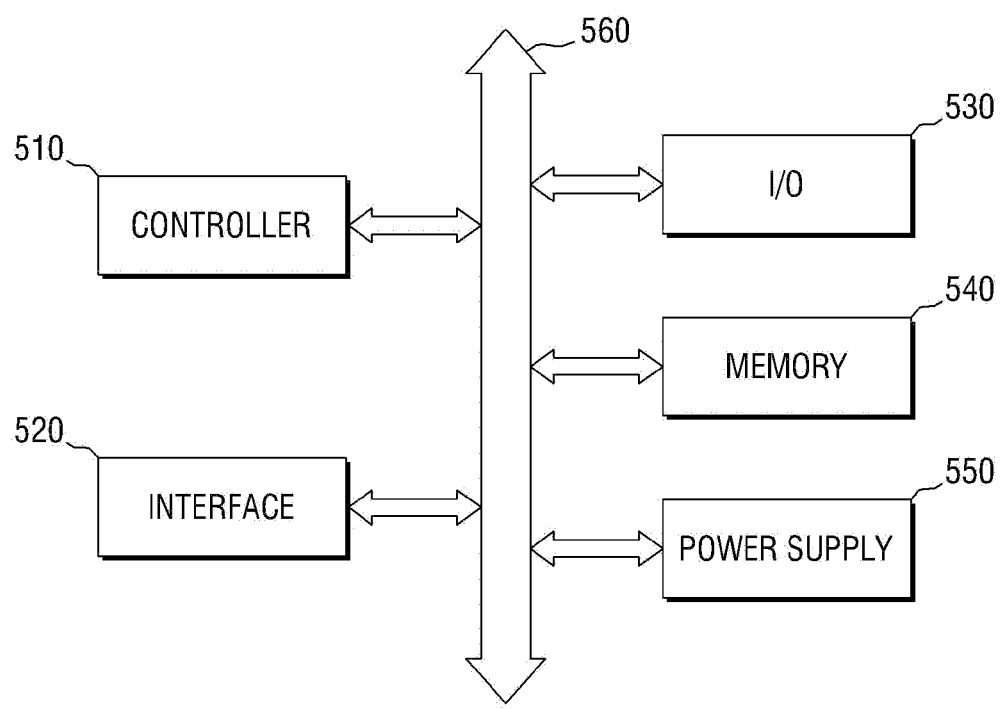
FIG. 32 is a schematic block diagram for describing an electronic system including the semiconductor device according to some embodiments of the present inventive concept.

Hereinafter, an electronic system including the semiconductor devices 1 to 9 according to some embodiments of the present inventive concept will be described. FIG. 32 is a schematic block diagram for describing an electronic system including at least one of the semiconductor devices 1 to 9 according to some embodiments of the present inventive concept.

Referring to FIG. 32, the electronic system may include a controller 510, an interface 520, an input/output device (I/O) 530, a memory 540, a power supply 550, and a bus 560.

The controller 510, the interface 520, the I/O 530, the memory 540, and the power supply 550 may be joined to each other through the bus 560. The bus 560 corresponds to a path in which data may move.

The controller 510 includes a microprocessor, a microcontroller, and at least one of logic elements that may perform similar functions thereto to thereby process data.

The interface 520 may serve to transmit data to a communication network or receive data from the communication network. The interface 520 may be a wired or wireless type. For example, the interface 520 may include an antenna or a wired/wireless transceiver.

The I/O 530 may include a keypad, touchpad, and a display device to input and output data.

The memory 540 may store data and/or a command. The semiconductor device according to some embodiments of the present inventive concept may be provided as a partial component of the memory 540.

The power supply 550 may convert power inputted from the outside and provide the power to each of the components 510 to 540.

Figure 33:
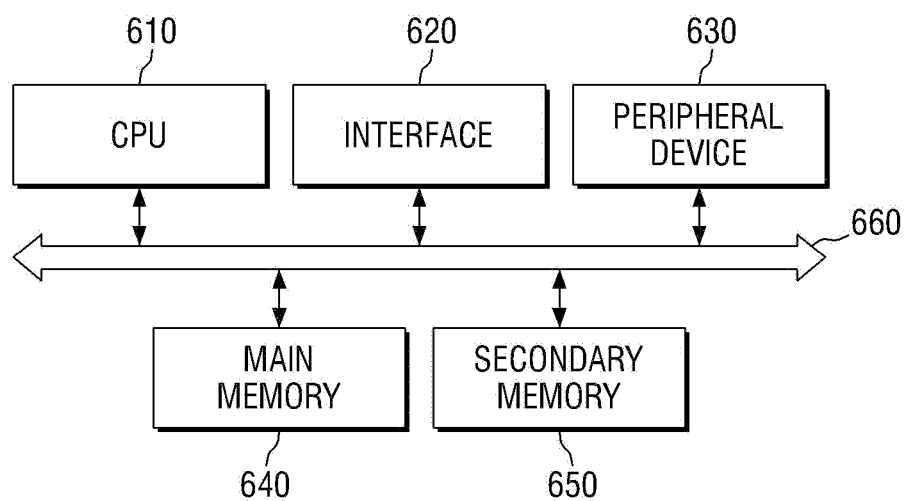
FIG. 33 is a schematic block diagram for describing an example application of the electronic system including the semiconductor device according to some embodiments of the present inventive concept.

FIG. 33 is a schematic block diagram for describing an example application of the electronic system including at least one of the semiconductor devices 1 to 9 according to some embodiments of the present inventive concept.

Referring to FIG. 33, the electronic system may include a central processing unit (CPU) 610, an interface 620, a peripheral device 630, a main memory 640, a secondary memory 650, and a bus 660.

The CPU 610, the interface 620, the peripheral device 630, the main memory 640, and the secondary memory 650 may be joined to each other through the bus 660. The bus 660 corresponds to a path in which data may move.

The CPU 610 includes a controller, an operator, and the like to execute a program and process data.

The interface 620 may serve to transmit data to a communication network or receive data from the communication network. The interface 620 may be a wired or wireless type. For example, the interface 620 may include an antenna or a wired/wireless transceiver.

The peripheral device 630 may include a mouse, a keyboard, a display device, and a printer device to input and output data.

The main memory 640 may transmit and receive data to and from the CPU 610 and store data and/or commands required to execute the program. At least one of the semiconductor devices 1 to 9 according to some embodiments of the present inventive concept may be provided as a partial component of the main memory 640 and/or the secondary memory 650.

The secondary memory 650 includes non-volatile storage devices including a magnetic tape, a magnetic disk, a flash semiconductor device, a floppy disk, a hard disk, an optical disk, and the like to store data and/or commands. The secondary memory 650 may store data even when a power supply of the electronic system is interrupted.

Besides, the semiconductor devices 1 to 9 according to some embodiments of the present inventive concept may be provided as one of various components of the electronic apparatus such as a computer, an ultra mobile PC (UMPC), a workstation, a net-book, a personal digital assistant (PDA), a portable computer, a web tablet PC, a wireless phone, a mobile phone, a smart phone, an e-book, a portable multimedia player (PMP), a portable game machine, a navigation device, a black box, a digital camera, a 3-dimensinoal television, a digital audio recorder, a digital audio player, a digital picture recorder, a digital picture player, a digital video recorder, a digital video player, a device capable of transmitting and receiving information under a wireless environment, one of various electronic apparatuses constituting a home network, one of various electronic apparatuses constituting a computer network, one of various electronic apparatuses constituting a telematics network, an RFID device, or one of various components constituting a computing system, and the like.

The foregoing is illustrative of the present inventive concept but is not to be construed as limiting thereof. Although a few embodiments of the present inventive concept have been described, those skilled in the art will readily appreciate that many modifications are possible in the embodiments without materially departing from the novel teachings and advantages of the present inventive concept. For example, the first and second semiconductor patterns 210 and 220 were drawn in pentagonal shapes, but the present disclosure also acknowledges the viability of diamond, hexagonal, heptagonal, and octagonal shapes (i.e. profiles), including with the various blocking and epitaxial layers of the above embodiments formed thereon. Accordingly, all such modifications are intended to be included within the scope of the present inventive concept as defined in the claims. Therefore, it is to be understood that the foregoing is illustrative of the present inventive concept and is not to be construed as limited to the specific embodiments disclosed, and that modifications to the disclosed embodiments, as well as other embodiments, are intended to be included within the scope of the appended claims. The present inventive concept is defined by the following claims, with equivalents of the claims to be included therein.

What is claimed is:

1. A semiconductor device comprising:
    a substrate provided with first and second active fins that extend lengthwise in a first direction and are separated in a second direction crossing the first direction by a field insulating layer;
    a gate structure which extends in the second direction on the first and second active fins;
    a first semiconductor pattern formed on the first active fin and disposed at a first side of the gate structure, the first semiconductor pattern comprising a first semiconductor material;
    a second semiconductor pattern formed on the second active fin and disposed at the first side of the gate structure, the second semiconductor pattern comprising the first semiconductor material; and
    a third semiconductor pattern conformally formed on and extending between a downwardly facing side of the first semiconductor pattern between the first and second active fins and a downwardly facing side of the second semiconductor pattern between the first and second active fins, the third semiconductor pattern comprising a second semiconductor material different from the first semiconductor material.

2. The semiconductor device of claim 1, wherein the first semiconductor pattern and the third semiconductor pattern contact each other.

3. The semiconductor device of claim 1 wherein one of the first semiconductor material and the second semiconductor material comprises one of the atomic elements C and Ge which is not present in the other of the first semiconductor material and second semiconductor material.

4. The semiconductor device of claim 1, wherein the third semiconductor pattern entirely covers a bottom facet of the first semiconductor pattern located between the first and second active fins.

5. The semiconductor device of claim 1, wherein the third semiconductor pattern entirely covers a downwardly facing facets of the first and second semiconductor patterns located between the first and second active fins.

6. The semiconductor device of claim 1, wherein the third semiconductor pattern entirely covers the external surface of the first semiconductor pattern and entirely covers the external surface of the second semiconductor pattern.

7. The semiconductor device of claim 1, wherein the first semiconductor material has a lattice constant smaller than a lattice constant of the second semiconductor material.

8. The semiconductor device of claim 1, further comprising a void below the third semiconductor pattern between the first semiconductor pattern and second semiconductor pattern and above the field insulating layer.

9. The semiconductor device of claim 1, further comprising a fourth semiconductor pattern formed in contact with and above the first semiconductor pattern and the second semiconductor pattern.

10. The semiconductor device of claim 9, wherein the first semiconductor pattern and the fourth semiconductor pattern are different from each other in a concentration of an impurity included in the first semiconductor material.

11. The semiconductor device of claim 1, wherein the first semiconductor material includes SiP, SiC, and/or SiCP.

12. The semiconductor device of claim 11, wherein the second semiconductor material includes SiGe.

13. The semiconductor device of claim 11, further comprising:
    tan upper pattern disposed on upper surfaces of the first semiconductor pattern
    and upper surfaces of the second semiconductor pattern,
    wherein the upper pattern includes the first semiconductor material, and
    wherein a concentration of phosphorus included in the upper pattern is higher than a concentration of phosphorus included in the first and second semiconductor patterns.

14. A semiconductor device comprising:
    first and second active fins which protrude from a substrate, first and second active fins extending in a first direction and separated in a second direction;
    a gate structure which extends in the second direction on the first and second active fins;
    a first semiconductor pattern formed on the first active fin;
    a second semiconductor pattern formed on the second active fin;
    a field insulating layer covering a lower part of both sides of the first and second active fins;
    a third semiconductor pattern formed on and extending from the field insulating layer and contacting the first and second semiconductor patterns in a region between the first and second active fins, the third semiconductor pattern including a first semiconductor material; and
    a fourth semiconductor pattern formed on the third semiconductor pattern and on the first and second semiconductor patterns and including a second semiconductor material different from the first semiconductor material of the third pattern.

15. The semiconductor device of claim 14, further comprising a void below the third semiconductor pattern between the first semiconductor pattern and second semiconductor pattern and above the field insulating layer.

16. The semiconductor device of claim 14, wherein one of the first semiconductor material and the second semiconductor material comprises one of the atomic elements C and Ge which is not present in the other of the first semiconductor material and second semiconductor material.

17. The semiconductor device of claim 14, wherein the first and second semiconductor patterns include the second semiconductor material.

18. The semiconductor device of claim 17, wherein a concentration of an impurity included in the fourth semiconductor pattern is higher than a concentration of an impurity included in the first and second semiconductor patterns.

19. A semiconductor device, comprising:
   a substrate in which a first region and a second region are defined, the substrate being provided with first and second active fins in the first region and third and fourth active fins in the second region;
   a first gate structure on the first and second active fins;
   a first semiconductor pattern, formed on the first and second active fins, disposed at least at one side of the first gate structure, and including a first semiconductor material;
   a second semiconductor pattern, formed on downwardly facing surfaces of the first semiconductor pattern between the first and second active fins and including a second semiconductor material different from the first semiconductor material;
   a second gate structure on the third and fourth active fins; and
   a third semiconductor pattern, formed on the third and fourth active fins, disposed at least at one side of the second gate structure, and including the second semiconductor material.

20. The semiconductor device of claim 19, further comprising a void below the second semiconductor pattern between the first and second active fins.

21. The semiconductor device of claim 19, wherein one of the first semiconductor material and the second semiconductor material comprises one of the atomic elements C and Ge which is not present in the other of the first semiconductor material and second semiconductor material.

22. The semiconductor device of claim 19, wherein the first semiconductor material includes an n-type impurity element.

23. The semiconductor device of claim 22, wherein the second semiconductor material includes germanium and the first semiconductor material comprises SiP, SiC, and/or SiCP.

24. The semiconductor device of claim 19, wherein the first semiconductor material comprises SiP, SiC, and/or SiCP.

25. The semiconductor device of claim 24, wherein the second semiconductor material comprises SiGe.

* * * * *